US012752534B2

(12) United States Patent
Kim

(10) Patent No.: US 12,752,534 B2
(45) Date of Patent: Oct. 6, 2026

(54) INKJET APPARATUS AND METHOD OF ALIGNING THE SAME

(71) Applicant: SAMSUNG DISPLAY CO., LTD., Yongin-si (KR)

(72) Inventor: Eunseok Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 146 days.

(21) Appl. No.: 18/744,299

(22) Filed: Jun. 14, 2024

(65) Prior Publication Data

US 2024/0416653 A1 Dec. 19, 2024

(30) Foreign Application Priority Data

Jun. 16, 2023 (KR) ........................ 10-2023-0077646

(51) Int. Cl.

| | |
|---|---|
| ***B41J 2/14*** | (2006.01) |
| ***B41J 2/045*** | (2006.01) |
| ***B41J 2/11*** | (2006.01) |
| ***B41J 2/175*** | (2006.01) |
| ***B41J 11/00*** | (2006.01) |
| ***B41J 25/00*** | (2006.01) |
| *B41J 2/135* | (2006.01) |
| *B41J 3/407* | (2006.01) |
| *B41J 29/393* | (2006.01) |
| *H10K 71/13* | (2023.01) |

(52) U.S. Cl.

CPC ........... *B41J 2/1433* (2013.01); *B41J 2/0456* (2013.01); *B41J 2/14* (2013.01); *B41J 2/175* (2013.01); *B41J 11/008* (2013.01); *B41J 2/135* (2013.01); *B41J 2002/14362* (2013.01); *B41J 2002/14491* (2013.01); *B41J 3/407* (2013.01); *B41J 25/001* (2013.01); *B41J 29/393* (2013.01); *B41J 2202/19* (2013.01); *B41J 2202/20* (2013.01); *H10K 71/135* (2023.02)

(58) Field of Classification Search

CPC . B41J 2/1433; B41J 2/0456; B41J 2/14; B41J 2/175; B41J 11/008; B41J 2/135; B41J 3/407; B41J 25/001; B41J 29/393; B41J 2002/14362; B41J 2002/14491; B41J 2202/19; B41J 2202/20; H10K 71/135

See application file for complete search history.

(56) References Cited

U.S. PATENT DOCUMENTS

2022/0134776 A1* 5/2022 Ko ......................... B41J 29/377 347/1
2023/0191776 A1* 6/2023 Lee .......................... B41J 2/155 347/19

FOREIGN PATENT DOCUMENTS

CN 212372971 U * 1/2021 .......... B41J 25/3086
CN 117124725 A 11/2023

(Continued)

*Primary Examiner* — Yaovi M Ameh

(74) *Attorney, Agent, or Firm* — F. CHAU & ASSOCIATES, LLC

(57) ABSTRACT

An inkjet apparatus includes a first plate, wherein the first plate is moveable, and a carrier module supported by the first plate and configured to receive a head pack including an inkjet head, wherein the carrier module including a first carrier part disposed above the first plate, a second carrier part, moveable relative to the first carrier part, and disposed under the first carrier part and above the first plate, and a third contact plate, moveable relative to the first carrier part, and disposed under the second carrier part and the first plate.

20 Claims, 18 Drawing Sheets

(56) References Cited

FOREIGN PATENT DOCUMENTS

| | | | | | |
|---|---|---|---|---|---|
| EP | 1875403 | B1 | * | 10/2014 | ............ B41J 25/001 |
| JP | 2007090327 | A | * | 4/2007 | ............... B05C 5/00 |
| KR | 10-1089880 | | | 11/2011 | |
| KR | 10-1160169 | | | 6/2012 | |
| KR | 10-1408786 | | | 6/2014 | |
| KR | 10-2014-0098662 | A | | 8/2014 | |
| KR | 10-1430742 | | | 8/2014 | |
| KR | 10-1713688 | | | 3/2017 | |
| KR | 10-2018-0034859 | A | | 4/2018 | |
| KR | 10-2022-0145493 | A | | 10/2022 | |

* cited by examiner

INKJET APPARATUS AND METHOD OF ALIGNING THE SAME

CROSS-REFERENCE TO RELATED APPLICATION(S)

This application claims priority to Korean Patent Application No. 10-2023-0077646, filed on Jun. 16, 2023, which is hereby incorporated by reference for all purposes as if fully set forth herein.

TECHNICAL FIELD

Embodiments relate to an inkjet apparatus. More particularly, embodiments relate to the inkjet apparatus and a method of aligning the same.

DISCUSSION OF RELATED ART

A display device is a device that displays an image for providing visual information to a user. Among the various types of display devices, organic light emitting diode (OLED) displays have become increasingly popular.

Inkjet printing technology may be used in a manufacturing process of display devices, and in particular the production of OLED displays. Inkjet printing offers advantages in terms of precision, cost-effectiveness, and scalability in the manufacturing process. Inkjet printing may provide for precision deposits of ink, producing fewer stray particles, and increasing yields over conventional mask-based technology.

SUMMARY

Embodiments provide an inkjet apparatus configured for rapid and accurate replacement of inkjet heads.

Embodiments provide a method of aligning the inkjet apparatus.

An inkjet apparatus may include a first plate, wherein the first plate is moveable, and a carrier module supported by the first plate and configured to receive a head pack including an inkjet head. The carrier module may include a first carrier part disposed above the first plate, a second carrier part, moveable relative to the first carrier part, and disposed under the first carrier part and above the first plate, and a third contact plate, moveable relative to the first carrier part, and disposed under the second carrier part and the first plate.

In an embodiment, the head pack may include a first contact plate, and a second contact plate disposed under the first contact plate, wherein the second carrier part of the carrier module may be detachably coupled to the first contact plate at certain positional relationship.

An inkjet apparatus according to an embodiment may include a head pack including an inkjet head, a first contact plate, and a second contact plate disposed under the first contact plate, an ink supply module, a first plate, and a carrier module disposed on the first plate and configured to receive the head pack. The carrier module may include a first carrier part connected to the ink supply module, a second carrier part disposed under the first carrier part and detachably coupled to the first contact plate, and a third contact plate disposed under the second carrier part and detachably coupled to the inkjet head.

In an embodiment, the carrier module may include a first shaft configured to connect the first carrier part and the second carrier part, and configured to move the second carrier part and the third contact plate toward the first carrier part, and a second shaft configured to connect the second carrier part and the third contact plate.

In an embodiment, the first contact plate may include a first protrusion protruding from a side surface of the first contact plate in a first direction substantially parallel to an upper surface of the first plate, and the second carrier part may include a second depression depressed in an upper surface of the second carrier part.

In an embodiment, the second contact plate may include a second depression in a direction opposite to the first direction, and the third contact plate may include a second protrusion protruding in the direction opposite to the first direction.

In an embodiment, the first protrusion may be mated to the first depression, and the second protrusion may be coupled to the second depression.

In an embodiment, inkjet head may include a plurality of nozzles including nozzle surfaces protruding from a lower part of the third contact plate, and the nozzle surfaces may be arranged in a first direction substantially parallel to an upper surface of the first plate and a second direction substantially parallel to the upper surface of the first plate and intersecting the first direction.

In an embodiment, a thicknesses of the nozzle surfaces in the third direction perpendicular to a plane defined by the first direction and the second direction may be substantially equal to each other.

In an embodiment, the third contact plate of the carrier module may include a plurality of first holes, the second contact plate of the head pack may include a plurality of second holes, the first plate may include a plurality of third holes and a plurality of fourth holes, the plurality of first holes and the plurality of third holes may be connected to each other through a first coupling member, the third contact plate and the first plate may be coupled to each other through the first coupling member, the plurality of second holes and the plurality of fourth holes may be connected to each other through a second coupling member, and the second contact plate and the first plate may be coupled to each other through the second coupling member.

In an embodiment, the second contact plate and the third contact plate may be spaced apart from each other in parallel.

In an embodiment, the head pack further may include a first support plate disposed between the first contact plate and the second contact plate, a second support plate disposed between the first contact plate and the second contact plate and disposed under the first support plate, an ink control module coupled to the first contact plate, the first support plate, and the second support plate and controlling ink ejection of the inkjet head, a first support member disposed between the first contact plate and the first support plate, and a second support member configured to connect the first support plate and the second contact plate.

In an embodiment, the first support member may include an elastic member.

In an embodiment, the inkjet apparatus may further include a second plate disposed on the first plate and coupled to the ink supply module, a third plate connected to the first plate and disposed perpendicular to the first plate, and a moving part contacting the third plate and configured to move the inkjet head.

In an embodiment, the inkjet apparatus may further include a first tension control module connected to the first plate and the second plate and a second tension control module connected to the first plate and the third plate.

A method of aligning an inkjet apparatus according to an embodiment may include separating a first carrier part and a second carrier part which are included in a carrier module, contacting a first contact plate included in a head pack and the second carrier part included in the carrier module, contacting a second contact plate included in the head pack and a third contact plate included in the carrier module, moving the second carrier part, the third contact plate, and the head pack through a first shaft included in the carrier module toward the first carrier part, coupling the third contact plate to a first plate, and coupling the second contact plate to the first plate.

In an embodiment, the contacting the first contact plate and the second carrier part may include mating a first depression included in the second carrier part to a second protrusion included in the first contact plate, and the contacting the second contact plate and the third contact plate may include coupling a second depression included in the second contact plate and a second protrusion included in the third contact plate.

In an embodiment, the contacting the third contact plate and the first plate may include coupling a plurality of first holes of the third contact plate to a plurality of third holes of the first plate through a first coupling member, and the contacting the second contact plate and the first plate may include coupling a plurality of second holes of the second contact plate to a plurality of fourth holes of the first plate through a second coupling member.

In an embodiment, the coupling through the first coupling member may include maintaining a distance between the second contact plate and the first plate supporting the carrier module and the head pack.

In an embodiment, the coupling through the second coupling member may include separating the second contact plate and the third contact plate.

In an inkjet apparatus according to embodiments of the present disclosure may include a head pack and a carrier module corresponding to the head pack, and the head pack may be coupled to the carrier module. Accordingly, the head pack may be coupled to a position corresponding to a coupling part of the carrier module. Therefore, process time and cost of an inkjet printing process may be reduced.

In addition, by fixing a direction in which the head pack is replaced to a normal direction of a first plate by the carrier module, an ink tube of the head pack may be connected to a first carrier part of the carrier module. Therefore, assembly defects may be reduced or prevented, and ink leakage may be reduced accordingly.

In a method of aligning an inkjet apparatus according to embodiments of the present disclosure may improve a degree of alignment of the head pack during the process of separating and combining the head pack by aligning a position of the head pack through contact between a second protrusion of the head pack and a second depression of the carrier module, and contact between a second recess of the head pack and a second projection of the carrier module.

In addition, since second contact plate may be spaced apart from a third contact plate and the first plate during coupling the carrier module to the first plate through a first coupling member and a second coupling member, the flatness of the head pack may be maintained.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
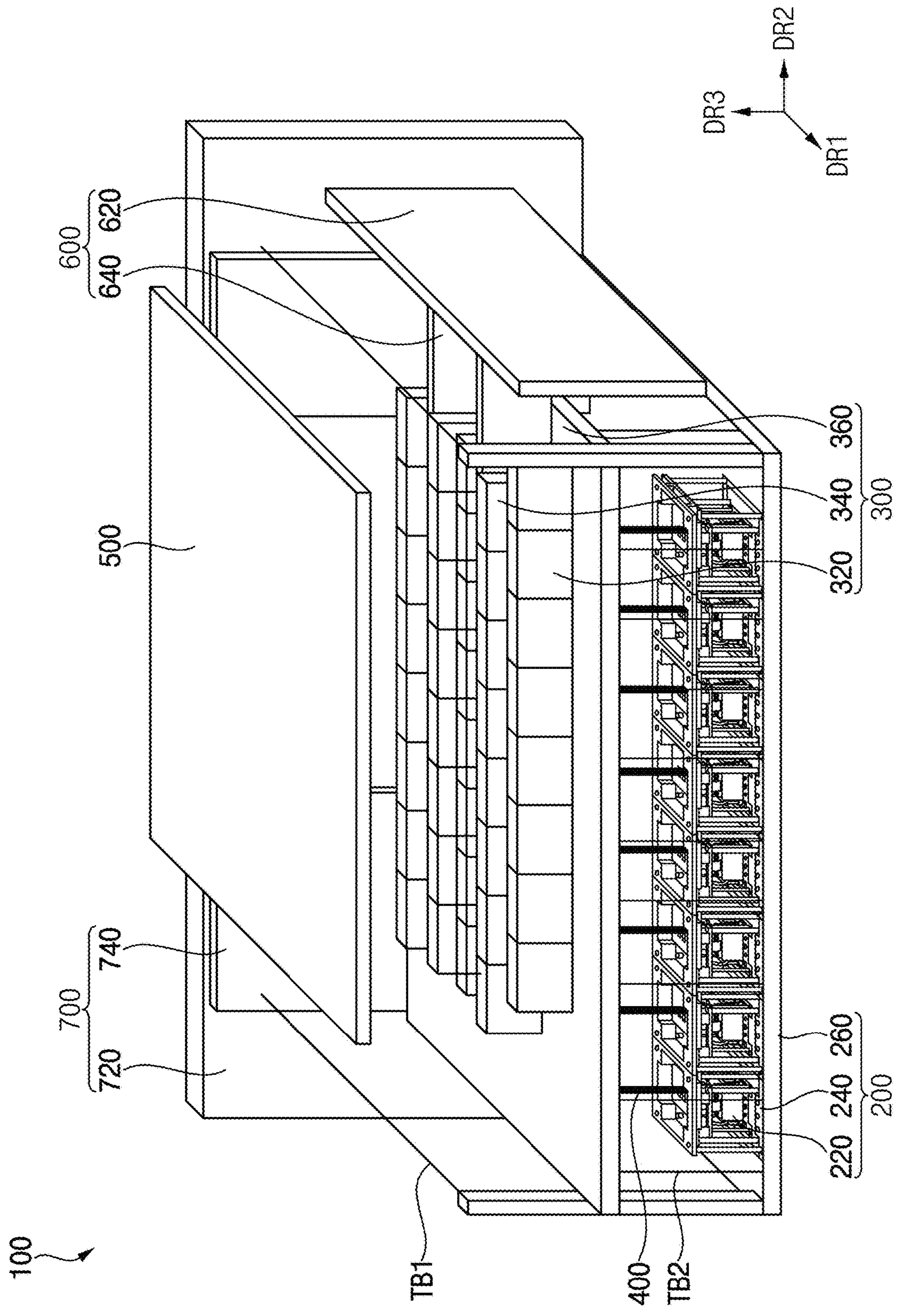
FIG. 1 is a perspective view illustrating an inkjet apparatus according to an embodiment of the present disclosure.

Hereinafter, an inkjet apparatus and a method of aligning the same in accordance with embodiments will be described in more detail with reference to the accompanying drawings. The same reference numerals are used for the same components in the drawings, and redundant descriptions of the same components may be omitted.

Figure 2:
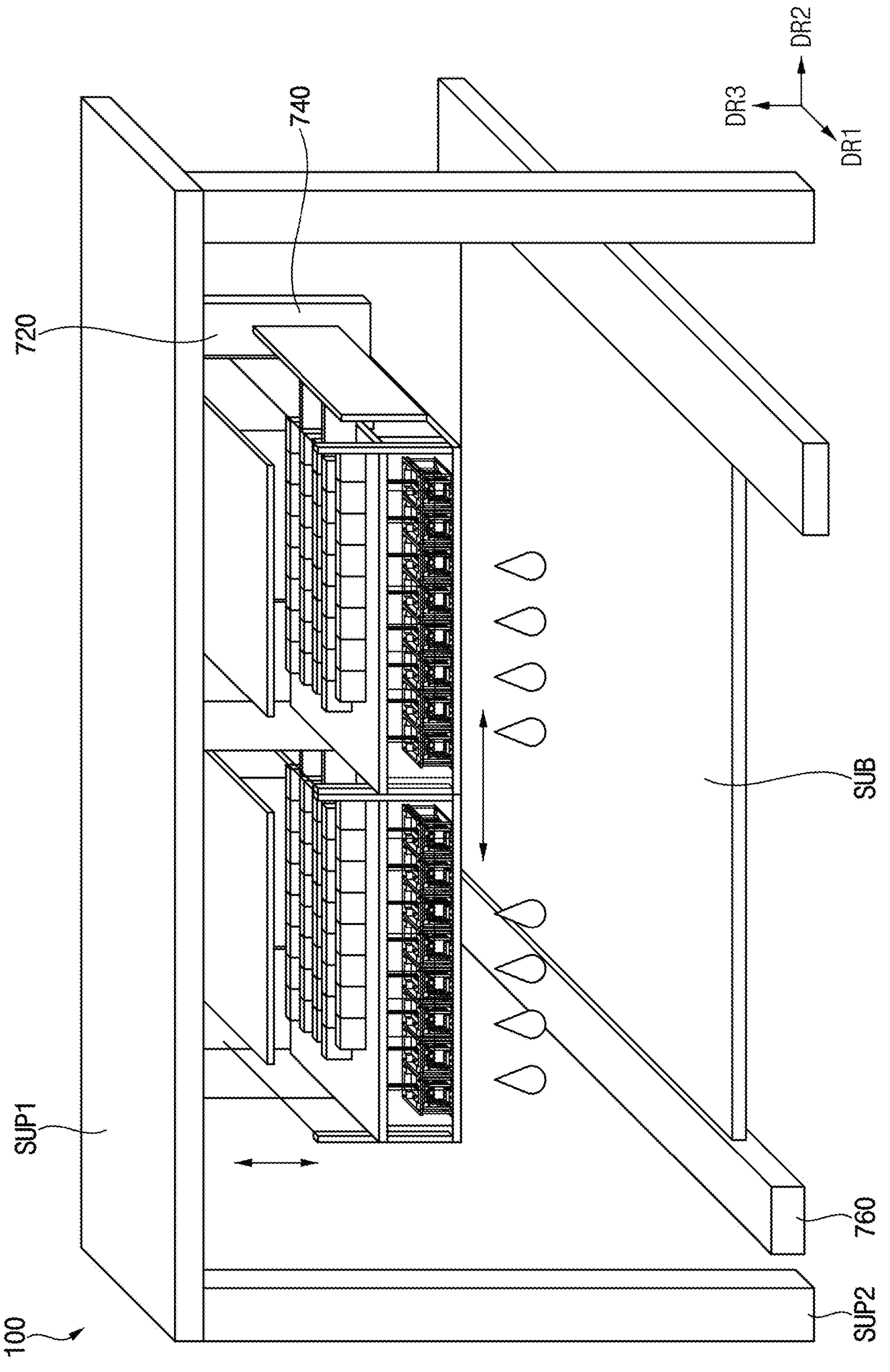
FIG. 2 is a perspective view illustrating an operation of the inkjet apparatus of FIG. 1.
Figure 3:
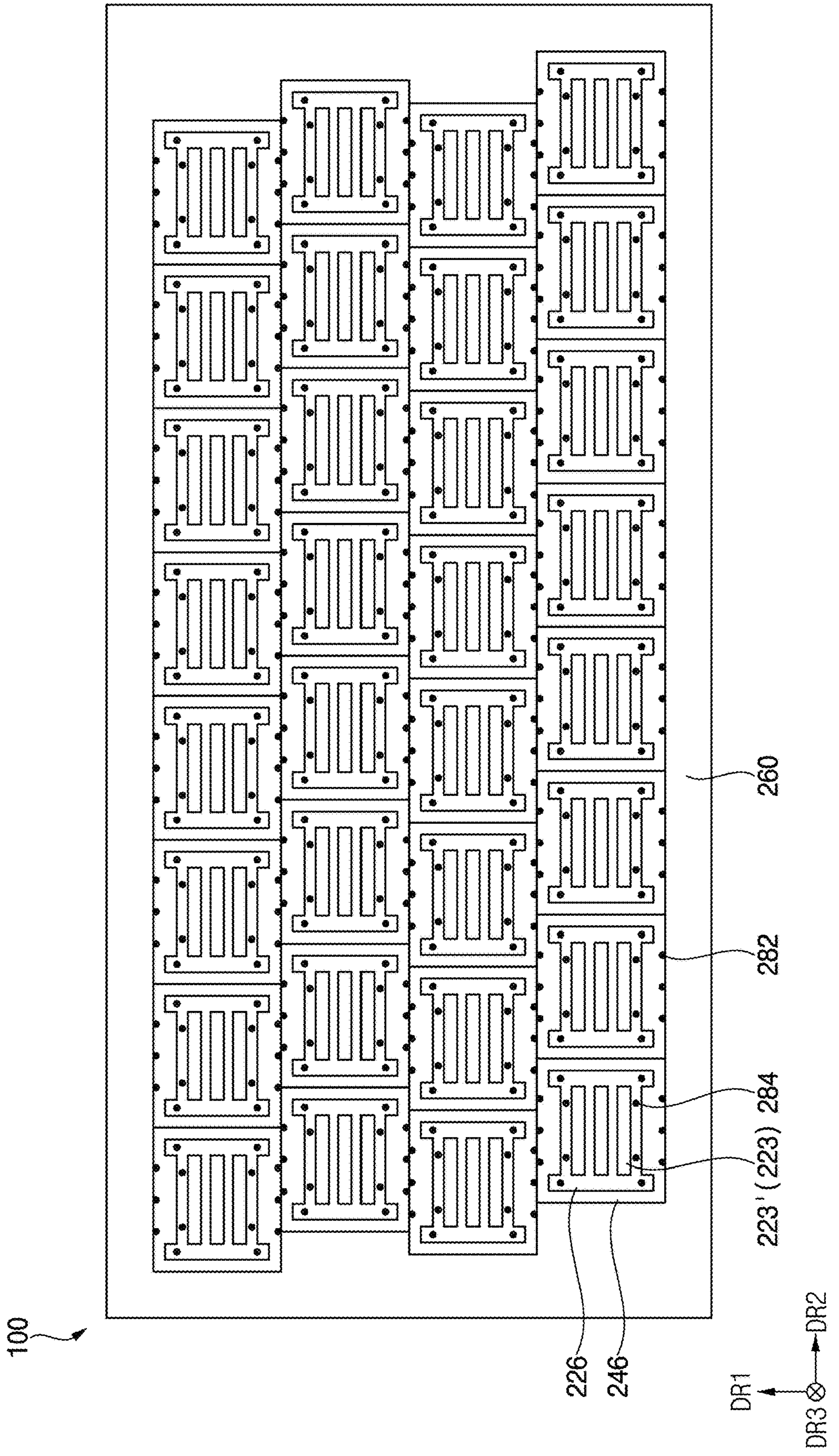
FIG. 3 is a rear view illustrating the inkjet apparatus of FIG. 1.

FIG. 1 is a perspective view illustrating an inkjet apparatus according to an embodiment of the present disclosure. FIG. 2 is a perspective view illustrating an operation of the inkjet apparatus of FIG. 1. FIG. 3 is a rear view illustrating the inkjet apparatus of FIG. 1. Referring to FIG. 1, FIG. 2, and FIG. 3, an inkjet apparatus 100 may include a head module 200, ink supply module 300, a connection part 400, a signal control part 500, an ink circulation part 600, a moving part 700, a first tension control module TB1, a second tension control module TB2, a first support part SUP1, and a second support part SUP2.

The head module 200 may include a head pack 220, a carrier module 240, and a first plate 260. The head module 200 may eject ink. For example, the head module 200 may be used to print materials on the surface of a substrate to form R (red), G (green), and B (blue) organic light-emitting layers.

The head pack 220 and the carrier module 240 may be coupled to each other. For example, the head pack 220 may be coupled to the corresponding carrier module 240 to form a combination of the head pack 220 and the carrier module 240. In detail, the carrier module 240 may surround the head pack 220, and a coupling part of the head pack 220 and the coupling part of the carrier module 240 may be coupled.

In addition, the head pack 220 may be separated from the carrier module 240. That is, the head pack 220 coupled to the carrier module 240 can be separated from the carrier module 240 and the head pack 220 may be replaced. The head pack 220 may be a consumable component, such that the head pack 220 may be replaced at some interval. Accordingly, process time and cost of an inkjet printing process can be reduced.

The head pack 220 and the carrier module 240 may be coupled to a first plate 260. For example, combinations of a plurality of head packs 220 and a plurality of carrier modules 240 may be coupled to the first plate 260.

Referring to FIG. 1, the head pack 220 and the carrier module 240 may be supported by the first plate 260. The first plate 260 may support a plurality of head packs 220 and a plurality of carrier modules. The first plate 260 may be moveable, e.g., by a head moving module 740 described herein. Movement of the first plate 260 may also move the head pack 220 and the carrier module 240.

Referring to FIG. 1 and FIG. 3, the combination of the head pack 220 and the carrier module 240 may penetrate the first plate 260 and may be coupled to the first plate 260. For example, a part of the head pack 220 and the carrier module 240 may protrude on an upper part of the first plate 260, and another part of the head pack 220 and the carrier module 240 may protrude on a lower part of the first plate 260.

Referring to FIG. 3, the part protruding from the lower part of the first plate 260 may include a third contact plate 246 included in the carrier module 240, a second contact plate 226 of the head pack 220, and a plurality of nozzles 223 included in an inkjet head 222. In addition, the second contact plate 226, the third contact plate 246, and the first plate may be coupled to each other through a first coupling member 282 and a second coupling member 284.

A plurality (e.g., over two) of the combination of the head pack 220 and the carrier module 240 may be disposed on the first plate 260. For example, the combinations of the head pack 220 and the carrier module 240 may be arranged in a first direction DR1 parallel to an upper surface of the first plate 260. In addition, the combinations of the head pack 220 and the carrier module 240 may be arranged an a zig-zag arrangement, and in a second direction DR2 intersecting the first direction DR1 on the first plate 260. For example, the first direction DR1 and the second direction DR2 may form a plane substantially parallel to an upper surface of the first plate, and the plane may be perpendicular to a third direction DR3. The second direction DR2 may be perpendicular to the first direction DR1.

In addition, surfaces of the nozzles 223' may be disposed on bottom surfaces of the combinations of the head pack 220 and the carrier module 240. Accordingly, the surfaces of the nozzles 223' may be equally arranged in the first direction DR1 and the second direction DR2 according to an arrangement of the combination of the head pack 220 and the carrier module 240.

In an embodiment, a plurality of the nozzles 223 may include the surfaces of the nozzles 223' exposed at a lower part of the third contact plate 246, and the surfaces of the nozzles 223' may be arranged in the first direction DR1 and the second direction DR2. In detail, the surfaces of the nozzles 223' may be arranged in in a zig-zag arrangement in the first direction DR1 and the second direction DR2. The plurality of the nozzles 223 may include the surfaces of the nozzles 223' protruding from the lower part of the third contact plate 246.

In an embodiment, thickness of the surfaces of the nozzles 223' in the third direction perpendicular to a plane defined by the first direction DR1 and the second direction DR2 may be substantially equal to each other. In detail, shortest distances (e.g., straight distances) between the surfaces of the nozzles 223' protruding from a lower part of the first plate 260 and a bottom surface of the first plate 260 may be substantially equal to each other. Accordingly, a flatness of a bottom surface of the head module 200 may be improved, and the printing quality of the inkjet apparatus 100 may be improved.

The configuration of the head pack 220, the carrier module 240, and the first plate 260 and their combination is described in more detail herein with reference to FIG. 4, FIG. 5, FIG. 6, FIG. 7, FIG. 8, and FIG. 9.

The ink supply module 300 may include a flow control valve 320, an ink supply passage 340, and a second plate 360.

The flow control valve 320 may adjust the driving pressure and flow rate of fluid (e.g., ink) delivered from the ink supply passage 340. The flow control valve 320 may constantly adjust the driving pressure and flow rate of fluid (e.g., ink) delivered from the ink supply passage 340. In addition, the ink may be supplied to the head pack 220 by controlling a direction of the ink.

The ink supply passage 340 may be a passage that transfers the ink from the ink circulation part 600 to the head pack 220. In addition, the ink supply passage 340 may be a passage for transferring the ink from the head pack 220 to the ink circulation part 600. That is, the ink supply passage 340 may be a circulation passage for ink flowing between the ink circulation part 600 and the head pack 220.

The flow control valve 320 and the ink supply passage 340 may be disposed on the second plate 360. In addition, the second plate 360 may be arranged substantially parallel to and spaced apart from the upper part of the first plate 260. Accordingly, the head module 200 and a connection part 400 may be disposed between the first plate 260 and the second plate 360.

The connection part 400 may include a plurality of lines configured to connect the head pack 220, the ink supply module 300, and the signal control part 500. For example, the connection part 400 may include a first connection part and a second connection part. The first connection part may be a fluid connection part and the second connection part may an electrical connection part.

The first connection part may connect the head pack 220 and the ink supply module 300. Ink delivered from the ink circulation part 600 may be delivered to the head pack 220 through the ink supply passage 340 and the first connection part. In addition, the process in which the ink is transferred from the head pack 220 to the ink circulation part 600 may include transferring the ink through the ink supply passage 340 and the first connection part.

The second connection part may connect the head pack 220 and the signal control part 500. An electrical signal that causes the inkjet head 222 to eject the ink may be transmitted from the signal control part 500 through the second connection part.

The signal control part 500 may receive a signal including movement information of a substrate SUB shown in FIG. 3, and generate an electrical signal based on the received signal including the movement information and the image to be generated. The electrical signal may be transmitted to the head pack 220 through the second connection part.

The ink circulation part 600 may include an ink circulation module 620 and an ink circulation passage 640.

The ink circulation module 620 may include an ink storage tank that stores ink, a valve that controls supply and circulation of the ink, and a pressure pump that may control the pressure of the ink.

The ink circulation passage 640 may be connected to the ink supply passage 340. The ink may be circulated and supplied between the ink circulation part 600 and the ink supply module 300 through the ink supply passage 340.

As shown in FIG. 1 and FIG. 2, the moving part 700 may include a third plate 720, a head moving module 740, a substrate moving module 760, a first support part SUP1, and a second support part SUP2.

The third plate 720 may be coupled to the first plate 260 and the second plate 360. For example, the first plate 260 and the second plate 360 may be substantially parallel to each other, and the third plate 720 may be vertically coupled to each of the first plate 260 and the second plate 360 on one side of the third plate 720. The second plate 360 may be disposed above the first plate 260.

The head moving module 740 may be coupled to the third plate 720. In addition, the head moving module 740 may be coupled to the first support part SUP1 to move the third plate 720 coupled to the head moving module 740.

For example, the head moving module 740 may move the third plate 720 in a direction parallel to the second direction DR2 and in a direction parallel to the third direction DR3. In detail, as the head moving module 740 moves the third plate 720, the head pack 220 and the carrier module 240 may be moved in the second direction DR2 and the third direction DR3. Accordingly, the inkjet apparatus 100 may eject the ink while moving the head module 200 on the substrate SUB in the second direction DR2 and the third direction DR3. In addition, position information of the substrate SUB may be measured by moving the head module 200 in the third direction DR3. For example, position information of the substrate SUB relative to the head module 200 may be measured.

The substrate moving module 760 may move the substrate SUB in a direction parallel to the first direction DR1. Accordingly, an area where ink is ejected from the head module 200 on the substrate SUB may be adjusted to be substantially parallel to the first direction DR1.

The substrate SUB may be an object that receives the ejected ink. For example, the substrate SUB may be glass. However, the substrate SUB is not limited to glass, and the substrate may include other materials.

In an embodiment, the inkjet apparatus 100 may include the first tension control module T1 connected to the first plate 260 and the second plate 360 and the second tension control module T2 connected to the first plate 260 and the third plate 720.

The first tension control module T1 may control a force applied between the first plate 260 and the second plate 360 according to the combination of the head pack 220 and the carrier module 240. Accordingly, the flatness of the first plate 260 and the second plate 360 may be maintained.

The second tension control module T2 may adjust the force applied between the first plate 260 and the third plate 720. For example, the second tension control module T2 may control tension so that the first plate 260 and the third plate 720 may be connected vertically to each other.

Figure 4:
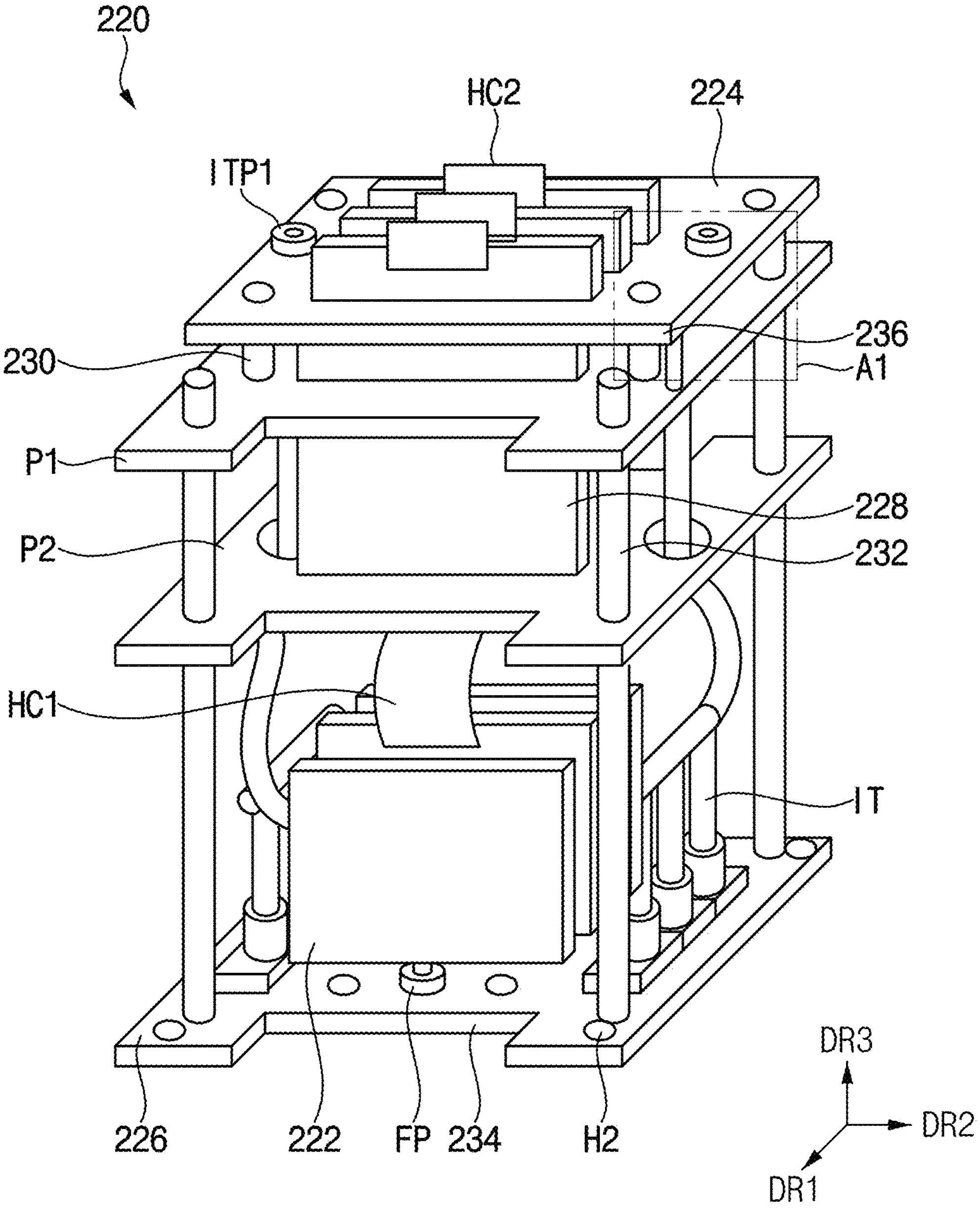
FIG. 4 is a perspective view illustrating a head pack included in the inkjet apparatus of FIG. 1.
Figure 5:
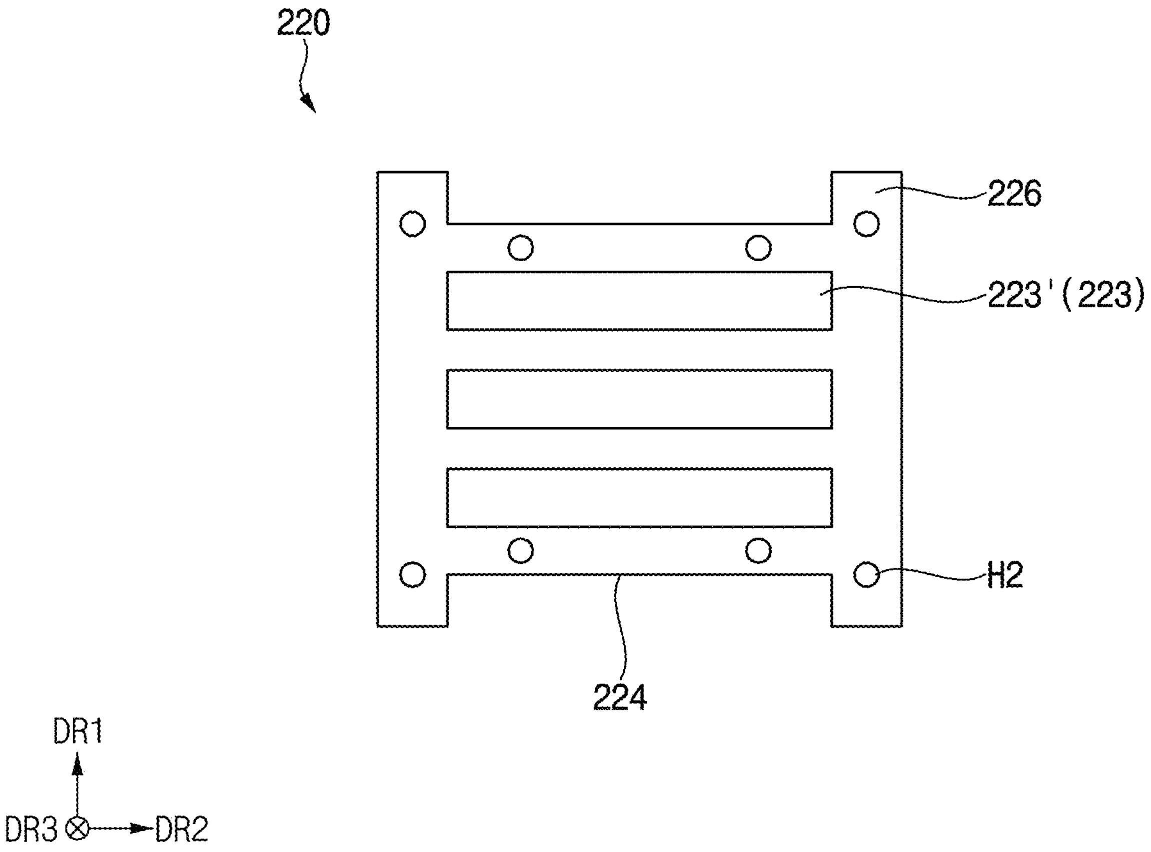
FIG. 5 is a rear view illustrating the head pack included in the inkjet apparatus of FIG. 1.

FIG. 4 is a perspective view illustrating a head pack included in the inkjet apparatus of FIG. 1. FIG. 5 is a rear view illustrating the head pack included in the inkjet apparatus of FIG. 1.

In detail, the head pack 220 in FIG. 4 may be in a state before being coupled to the carrier module 240. In addition, FIG. 5 may show the bottom surface of a second support plate P2 of the head pack 220 before the head pack 220 is coupled to the carrier module 240.

Referring to FIG. 4 and FIG. 5, the head pack 220 may include the inkjet head 222, a first contact plate 224, a plurality of the nozzles 223, the second contact plate 226, an ink control module 228, a first support member 230, a second support member 232, a first support plate P1, a second support plate P2, an ink tube IT, a first ink tube connection part ITP1, a first ink control module connection part HC1, a second ink control module connection part HC2, and a fixing pin FP.

The inkjet head 222 may eject the ink supplied from the ink circulation part 600 onto the substrate SUB. The head pack 220 may include at least one (e.g., two) inkjet heads 222. However, the number of the inkjet heads 222 included in the head pack 220 is not limited to this.

In an embodiment, the number of the inkjet heads 222 included in a head pack 220 may be in a range of 1 to 5. Preferably, the number of inkjet heads 222 included in a head pack 220 may be in a range of 3 to 5.

Although, three inkjet heads 222 may be shown in the head pack 220 in FIG. 1 to FIG. 19, this may be for schematic illustration of the head pack 220, and the number of inkjet heads 222 may not be limited to this.

A plurality of the nozzles 223 may be disposed at the lower part of the head pack 220. The plurality of nozzles 223 may be disposed under the inkjet head 222 and may be exposed from the lower part of the second contact plate 226. For example, the plurality of nozzles 223 may be disposed under the inkjet head 222 and protrude from the lower part of the second contact plate 226.

The first contact plate 224 may include the first ink tube connection part ITP1. For example, the first ink tube connection part IPT1 may be disposed on the upper surface of the first contact plate 224.

The ink tube IT may be coupled adjacent to the inkjet head 222. The ink tube IT may directly supply the ink to the inkjet head 222. The ink tube IT may be connected to the first ink tube connection part ITP1 of the first contact plate 224.

In addition, the first contact plate 224 may be coupled to the upper part of the carrier module 240. For example, the first contact plate 224 may be coupled to the second carrier part 244 of the carrier module 240 through a first protrusion 236. This is explained in more detail herein with reference to FIG. 7 and FIG. 8.

The second contact plate 226 may be coupled to the inkjet head 222. For example, the inkjet head 222 may be coupled through the first contact plate 224. For example, as shown in FIG. 5, a surface of nozzle 223' of the plurality of nozzles 223 may be exposed the bottom surface of the second contact plate 226. The surface of nozzle 223' of the plurality of nozzles 223 may protrude from the bottom surface of the second contact plate 226. That is, the surfaces disposed at a lower part of the head module 200 may be lower surfaces of the plurality of nozzles 223, including a lower surface of the nozzle 223'.

The second contact plate 226 may be coupled to the lower part of the carrier module 240. For example, the second contact plate 226 may be coupled to the third contact plate 246 of the carrier module 240 through a second depression 234 and the fixing pin FP. This is explained in more detail herein with reference to FIG. 6.

In addition, the second contact plate 226 may be coupled to the first plate 260. For example, the second contact plate 226 may be coupled to the first plate 260 through a plurality of second holes H2 of the second contact plate 226.

The ink control module 228 may control the ejection of ink from the plurality of surfaces of nozzle 223' of the inkjet head 222 coupled to the second contact plate 226. For example, the ink control module 228 may transmit an electrical signal that controls the ejection of the ink of the inkjet head 222 from the signal control part 500 to the inkjet head 222 and the plurality of nozzles 223.

In an embodiment, the ink control module 228 may be an interface board.

The first ink control module connection part HC1 may be disposed under the ink control module 228. For example, the ink control module 228 may be detachably coupled to the inkjet head 222 disposed under the ink control module 228 through the first ink control module connection part HC1. In detail, the ink control module 228 and the inkjet head 222 may be coupled to each other through the first ink control module connection part HC1. Similarly, a plurality of ink control modules 228 and a plurality of inkjet heads 222 may be coupled, respectively, to each other through the first ink control module connection part HC1. That is, the number of inkjet heads 222 and the number of ink control modules 228 included in the head pack 220 may be the same.

In addition, a second ink control module connection part HC2 may be disposed on the ink control module 228. For example, the ink control module 228 may be detachably coupled to the second connection part of the connection part 400 described above in FIG. 1, FIG. 2 and, FIG. 3 through the second ink control module connection part HC2. That is, the electrical signal may be directly transmitted to the head pack 220 through the second ink control module connection part HC2. When replacing the head pack 220, the ink control module 228 may be detached from the second connection part of the connection part 400.

The first support plate P1 and the second support plate P2 may be disposed between the first contact plate 224 and the second contact plate 226. The first support plate P1 may be disposed on the second support plate P2, and the first support plate P1 may be disposed on the second support plate P2 may be arranged to be spaced apart.

The first contact plate 224 and the first support plate P1 may be spaced apart and arranged substantially in parallel, and the first contact plate 224 and the first support plate P1 may be coupled through the first support member 230. In addition, the second support member 232 may connect the first support plate P1, the second support plate P2, and the second contact plate 226 to each other. For example, the first support member 230 may be a cylindrical rod that penetrates the first support plate P1, the second support plate P2, and the second contact plate 226. However, the shape of the first support member 230 is not limited to this.

In an embodiment, the first support member 230 may include an elastic member. The elastic member may include a spring, for example. Accordingly, when the head pack 220 and the carrier module 240 are coupled, the load and external force of the carrier module 240 transmitted to the second support plate P2 may be reduced. However, the type of the elastic member may not be necessarily limited to the spring.

Figure 6:
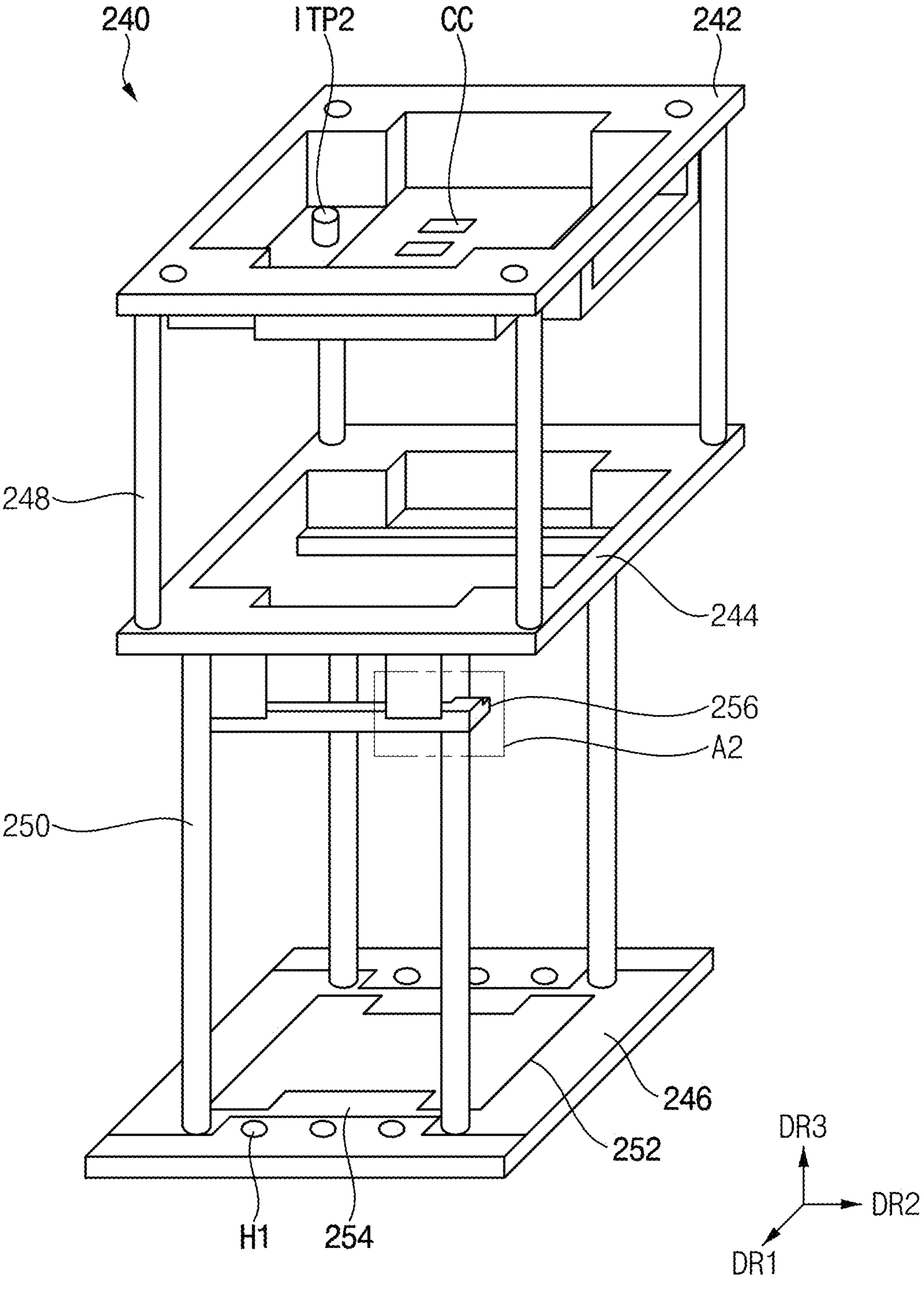
FIG. 6 is a perspective view illustrating a carrier module included in the inkjet apparatus of FIG. 1.
Figure 7:
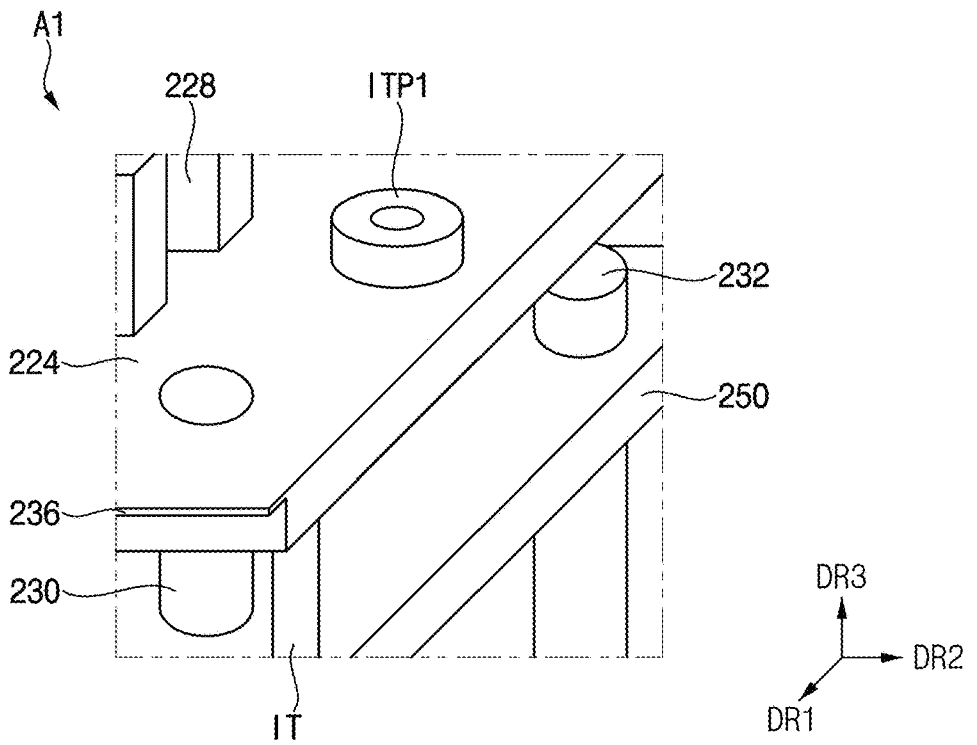
FIG. 7 is an enlarged perspective view of the "A1" area of FIG. 4.
Figure 8:
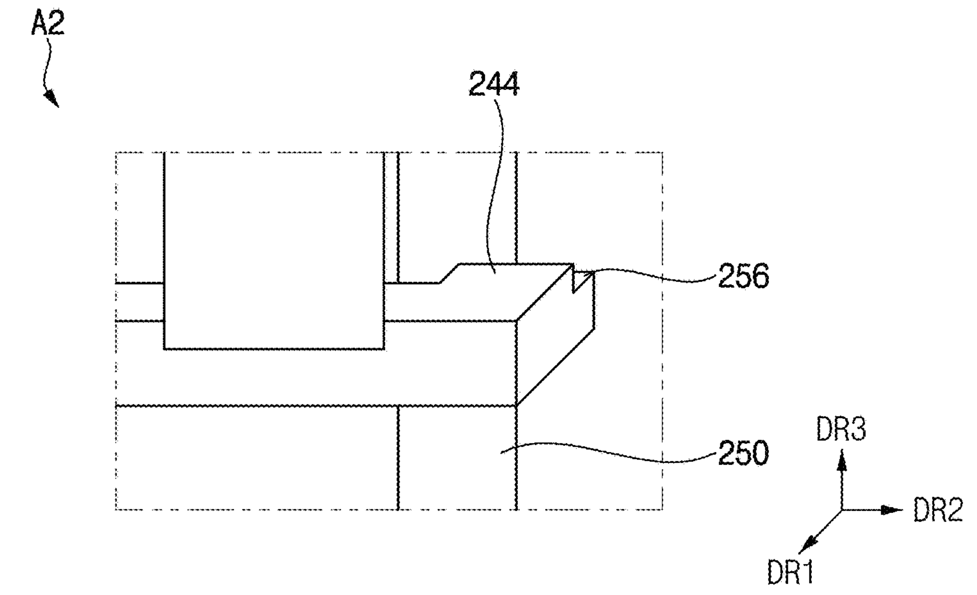
FIG. 8 is an enlarged perspective view of the "A2" area of FIG. 6.

FIG. 6 is a perspective view illustrating a carrier module included in the inkjet apparatus of FIG. 1. FIG. 7 is an enlarged perspective view of the "A1" area of FIG. 4. FIG. 8 is an enlarged perspective view of the "A2" area of FIG. 6.

Referring to FIG. 6, the carrier module 240 may include a first carrier part 242, a second carrier part 244, the third contact plate 246, a first shaft 248, a second shaft 250, a second ink tube connection part IPT2, and a cable connection part CC.

The first carrier part 242 may connect to the ink supply module 300. The first carrier part 242 may include the second ink tube connection part IPT2 and the cable connection part CC. The ink tube connection part IPT2 may be coupled to the first ink tube connection part ITP1 included in the head pack 220. Accordingly, the ink tube IT1 may be coupled to the connection part 400 through the first ink tube connection part ITP1 and the ink tube connection part IPT2. That is, the ink supplied from the ink supply module 300 may be supplied to the ink tube IT through the first connection part of the connection part 400, the first ink tube connection part IPT1, and the second ink tube connection part ITP2.

The cable connection part CC may be detachably coupled to the second ink control module connection part HC2 shown in FIG. 4. For example, when the head pack 220 and the carrier module 240 are coupled, the cable connection part CC of the first carrier part 242 may be coupled to an upper part of the second ink control module connection part HC2. Accordingly, when the head pack 220 and the carrier module 240 are coupled, an electrical signal may be transmitted from the signal control part 500 to the ink control module 228. For example, the electrical signal may be transmitted from the signal control part 500 to the ink control module 228 through the second connection part of the connection part 400, the cable connection part CC, and the second ink control module connection part HC2. When replacing the head pack 220, the cable connection part CC may be detached from the second ink control module connection part HC2.

The second carrier part 244 may be disposed under the first carrier part 242. In addition, when the carrier module 240 and the first plate 260 are coupled, the second carrier part 244 may be disposed on the upper part of the first plate 260.

The second carrier part 244 may be detachably coupled to the first contact plate 224 of the head pack 220. A contact part of the second carrier part 244 and a contact part of the first contact plate 224 may have a coupling part that may be coupled to each other. When replacing the head pack 220, the second carrier part 244 may be detached from the first contact plate 224 of the head pack 220.

In an embodiment, referring to FIG. 7 and FIG. 8, the first contact plate 224 may include a first protrusion 236 protruding in the first direction DR1 from a side surface of the first contact plate 224, and the second carrier part 244 may include a first depression 256 depressed in an upper surface of the second carrier part 244. Accordingly, the first protrusion 236 may be mated to the first depression 256. For example, the first protrusion 236 and the first depression 256 may cooperate to couple the first contact plate 224 and the second carrier part 244.

In other words, as the first protrusion 236 and the first depression 256 may be mated, and the first contact plate 224 of the head pack 220 and the second carrier part 244 of the carrier module 240 may be coupled.

However, a protrusion direction of the first protrusion 236 and a depression direction of the first depression 256 in FIG. 7 and FIG. 8 may not be limited to the first direction DR1. For example, the protrusion direction of the first protrusion 236 and the depression direction of the first depression 256 may be opposite to the first direction DR1.

In detail, although not shown in FIG. 4, FIG. 5, FIG. 6, and FIG. 7, the first protrusion 236 may also be disposed on an edge of the first contact plate 224 in a direction opposite to the first direction DR1. In addition, although not shown in FIG. 6, FIG. 7, and FIG. 8, the first depression 256 may also be disposed on an edge of the second carrier part 244 in a direction opposite to the first direction DR1.

Meanwhile, a protruding shape of the first protrusion 236 and the depressed shape of the first depression 256 may not be limited to the hexahedron shown in FIG. 7 and FIG. 8 and may have various shapes.

The third contact plate 246 may be disposed under the second carrier part 244. In addition, when the head pack 220 and the carrier module 240 are coupled, the third contact plate 246 may be disposed under the second contact plate 226.

When the third contact plate 246 and the second contact plate 226 are coupled, a head coupling part 252 included in the third contact plate 246 and the inkjet head 222 may be coupled. For example, the head coupling part 252 may be an opening having the shape of a plane perpendicular to the third direction DR3. In detail, the inkjet head 222 may pass through the opening and may be coupled to the third contact plate 246, and the surfaces of the nozzles 223' may protrude from a lower part of the third contact plate 246.

The third contact plate 246 may be coupled to the second contact plate 226. A contact part of the third contact plate 246 and a contact part of the second contact plate 226 may have a coupling part that may be coupled to each other.

In an embodiment, as shown in FIG. 4, FIG. 5, and FIG. 6, the second contact plate 226 may include the second depression 234 depressed in a direction opposite to the first direction DR1, and the third contact plate 246 may include a second protrusion 254 protruding in a direction opposite to the first direction. Accordingly, the second protrusion 254 may be coupled to the second depression 234.

In other words, as the second protrusion 254 and the second depression 234 are coupled, the second contact plate 226 of the head pack 220 and the third contact plate 246 of the carrier module 240 may be coupled.

However, a recess direction of the second depression 234 and a projection direction of the second protrusion 254 in FIGS. 4, 5, and 6 may not be limited to the direction opposite to the first direction DR1. For example, the recess direction of the second depression 234 and the projection direction of the second protrusion 254 may be in the first direction DR1.

In detail, as shown in FIG. 5, the second contact plate 226 include two second depressions 234 in the first direction DR1 and in a direction opposite to the first direction DR1. In addition, as shown in FIG. 6, the third contact plate 246 may have two second protrusions 254 protruding in the first direction DR1 and in a direction opposite to the first direction DR1.

Meanwhile, the depressed shape of the second depression 234 and the protruding shape of the second protrusion 254 may not be limited to the hexahedral shape shown in FIG. 4 and FIG. 6 and may have various shapes.

As described above, the first protrusion 236 may be mated to the first depression 256, and the second protrusion 254 may be coupled to the second depression 234. Accordingly, when the head pack 220 is coupled to the carrier module 240, the head pack 220 and carrier module 240 may be easily coupled to corresponding positions. Accordingly, the process time and cost of the inkjet printing process may be reduced.

The first shaft 248 may be fixed and coupled to the first carrier part 242. In addition, the first shaft 248 may not be fixed and coupled to the second carrier part 244. Accordingly, the second carrier part 244 may move along the first shaft 248 in the third direction DR3 or in a direction opposite to the third direction DR3.

The second shaft 250 may be disposed between the second carrier part 244 and the third contact plate 246. For example, as shown in FIG. 6, the second shaft 250 may be a bar coupled to four corner parts of each of the second carrier part 244 and the third contact plate 246.

The second shaft 250 may be fixedly coupled to the second carrier part 244 and the third contact plate 246. In detail, the second carrier part 244 and the third contact plate 246 may be arranged to be spaced apart. Accordingly, the head pack 220 may be coupled between the second carrier part 244 and the third contact plate 246.

In addition, when the head pack 220 and the carrier module 240 are coupled, the first shaft 248 may be disposed outside the second shaft 250. Accordingly, when the head pack 220 is coupled to the carrier module 240, the head pack 220 may be disposed inside the second shaft 250 and may move along the second carrier part 244 in the third direction DR3.

Figure 9:
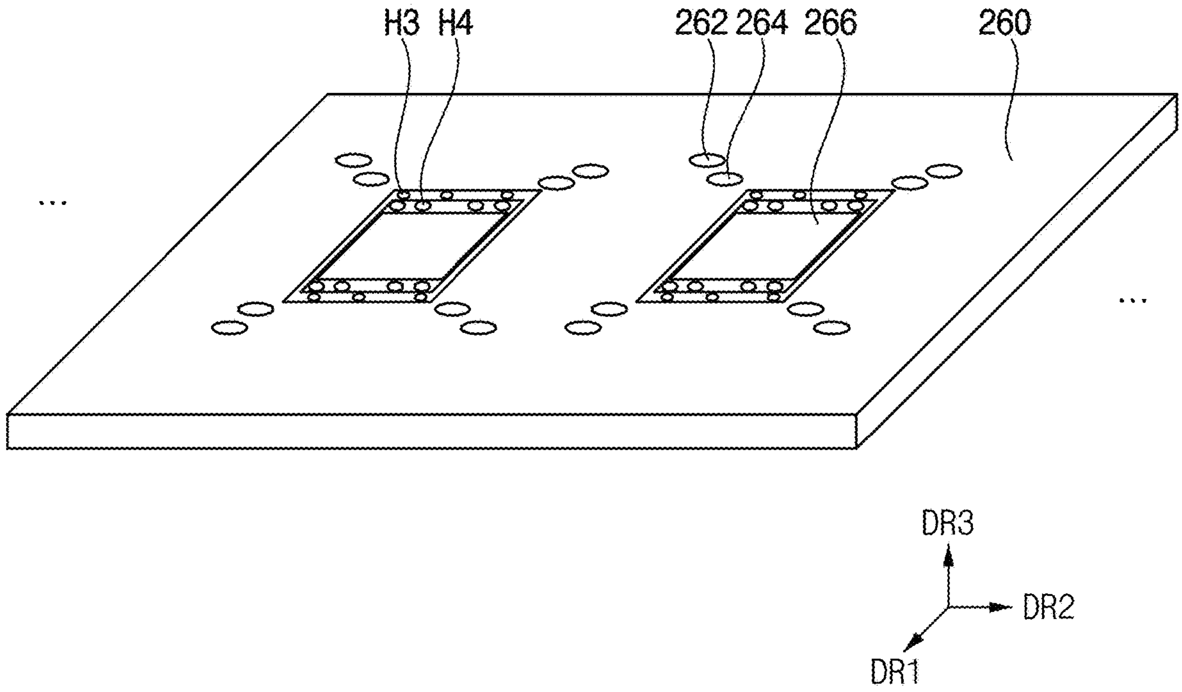
FIG. 9 is a perspective view illustrating a first plate included in the inkjet apparatus of FIG. 1.

FIG. 9 is a perspective view illustrating a first plate included in the inkjet apparatus of FIG. 1.

Referring to FIG. 9, the first plate 260 may include a first shaft coupling part 262, a second shaft coupling part 264, a head coupling part 266, a plurality of third holes H3, and a plurality of fourth holes H4.

The first shaft coupling part 262 may couple the first shaft 248 and the first plate 260. For example, the first shaft coupling part 262 may be a hole capable of coupling the first shaft 248 and the first plate 260 in the third direction DR3. In detail, the first shaft 248 may be coupled to the first plate 260 through the hole of the first shaft coupling part 262 without protruding from a lower surface of the first plate 260 (see FIG. 14). For example, the hole of the first shaft coupling part 262 may not pass entirely through the first plate 260. In another example, a bottom surface of the first shaft 248 may be coplanar with a bottom surface of the first plate 260.

The second shaft coupling part 264 may couple the second shaft 250 and the first plate 260. For example, the second shaft coupling part 264 may be a hole that can couple the second shaft 250 and the first plate 260 in the third direction DR3. In detail, the second shaft 250 may protrude from the lower surface of the first plate 260 and be coupled to the third contact plate 246 through the hole. That is, the second shaft 250 may penetrate the first plate 260 through the second shaft coupling part 264 and couple the second carrier part 244 and the third contact plate 246.

When the first plate 260 and the third contact plate 246 are coupled, locations of a plurality of the third holes H3 may overlap with locations of a plurality of first holes H1 of the third contact plate 246 in the third direction DR3. In an embodiment, the plurality of first holes H1 and the plurality of third holes H3 may be connected through the first coupling member 282 shown in FIG. 3, and thus the first plate 260 and the third contact plate 246 may be coupled. For example, the first coupling member 282 may pass through plurality of the first holes H1 and plurality of the third holes H3.

Meanwhile, the plurality of the first holes H1 and the plurality of the third holes H3 may not overlap with the second contact plate 226 in the third direction DR3. Accordingly, the first coupling member 282 may couple the first plate 260 and the third contact plate 246.

The plurality of the first holes H1 and the plurality of the third holes H3 shown in FIG. 6 and FIG. 9 may be aligned when one carrier module 240 and the first plate 260 are coupled. As illustrated, four of the first holes H1 and four of the third holes H3 may be provided. However, the number of first holes H1 and third holes H3 may not be limited to this.

When the first plate 260 and the second contact plate 226 are coupled, positions of a plurality of the fourth holes H4 may overlap with positions of a plurality of the second holes H2 of the second contact plate 226 in the third direction DR3. When the first plate 260 and the second contact plate 226 are coupled, positions of the plurality of the fourth holes H4 may be aligned with positions of the plurality of the second holes H2 of the second contact plate 226 in the third direction DR3. In an embodiment, the plurality of the second holes H2 and the plurality of the fourth holes H4 may be connected through the second coupling member 284 shown in FIG. 3, and thus the first plate 260 and the second contact plate 226 may be coupled. For example, the second coupling member 284 may pass through the plurality of the second holes H2 and the plurality of the fourth holes H4.

The plurality of the second holes H2 and the plurality of the fourth holes H4 shown in FIG. 4 and FIG. 9 may be aligned when one head pack 220 and the first plate 260 are coupled. As illustrated, four of the second holes H2 and four of the fourth holes H4 may be provided. However, the number of second holes H2 and the fourth holes H4 may not be limited to this.

The number of plurality of the first holes H1 and the number of plurality of the third holes H3 described herein may be the same in the area where the first plate 260 and the carrier module 240 overlap. In addition, the plurality of the second holes H2 and the plurality of the fourth holes H4 may be equal in number in the area where the first plate 260 and one head pack 220 overlap.

A lower surface of the inkjet head 222 may be coupled to the head coupling part 266 included in the first plate 260. For example, the head coupling part 266 may be an opening having the shape of a plane perpendicular to the third direction DR3. In detail, when the inkjet head 222 on the second contact plate 226 is coupled to the head coupling part 252 of the third contact plate 246, the inkjet head 222 may be connected to the lower part of the first plate 260 through the opening. A plurality of the nozzles 223 of the head 222 may protrude from the lower part of the first plate 260 through the opening.

A planar area of the head coupling part 266 of the first plate 260 may be smaller than a planar area of the third contact plate 246 perpendicular to the third direction DR3. Accordingly, when the second carrier part 244 and the third contact plate 246 move in the third direction DR3 through the first shaft 248, since the third contact plate 246 may not pass thorough the head coupling part 266, the third contact plate 246 may be disposed under the first plate 260. For example, third contact plate 246 may be disposed entirely under the first plate 260.

Figure 10:
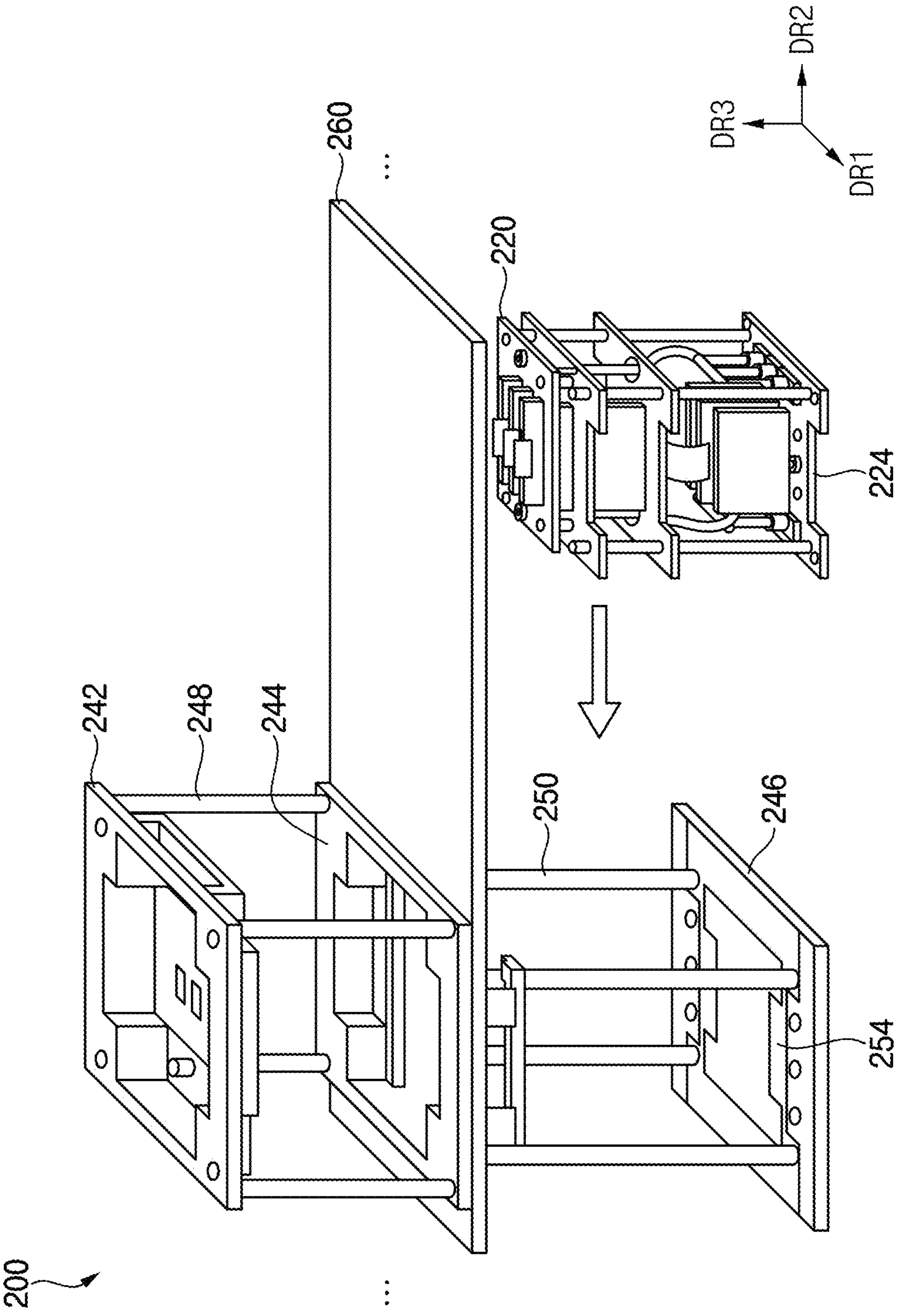
FIG. 10, FIG. 11, and FIG. 12 are perspective views illustrating a method of aligning the inkjet apparatus according to an embodiment of the present disclosure.
Figure 11:
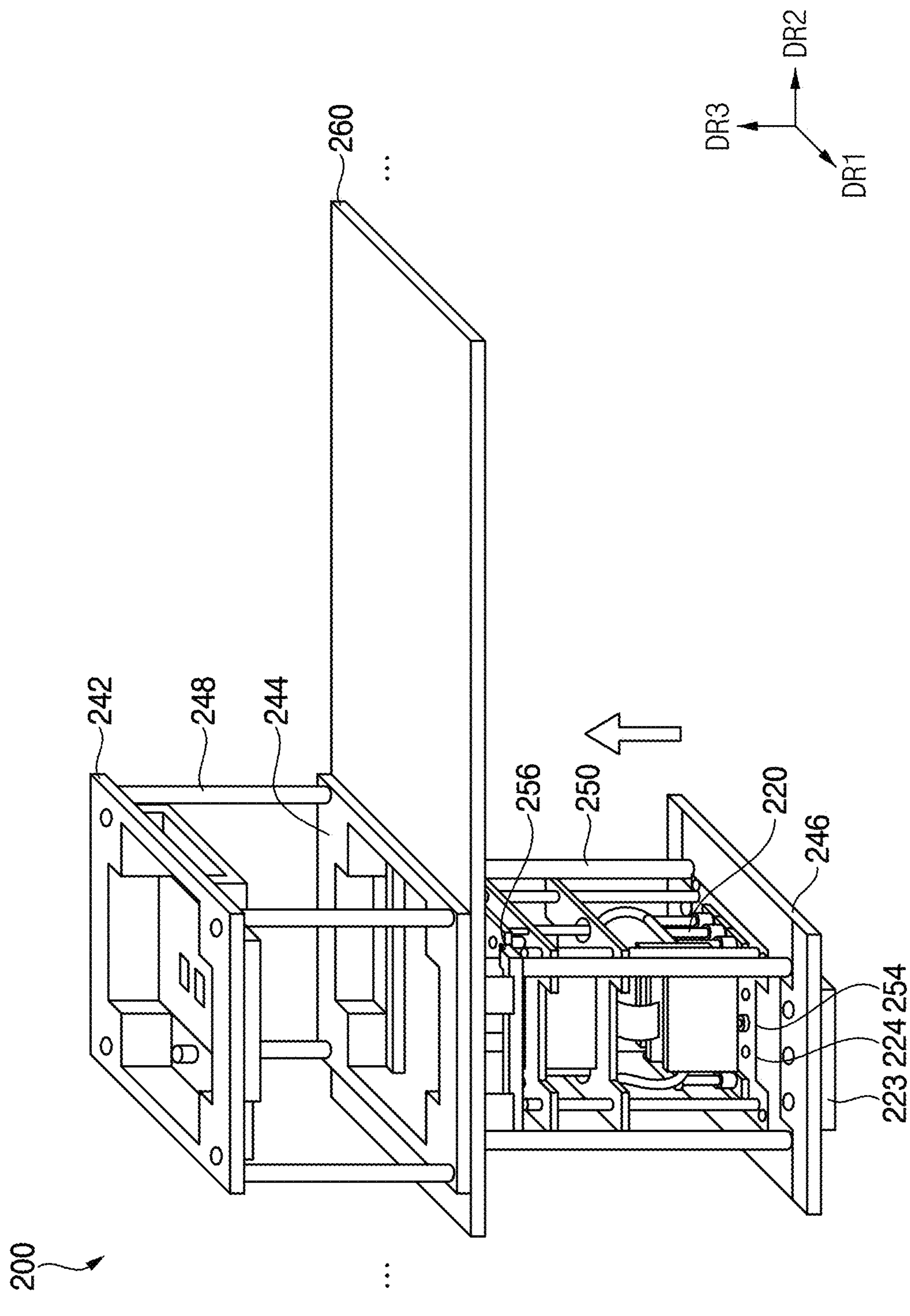
Figure 12:
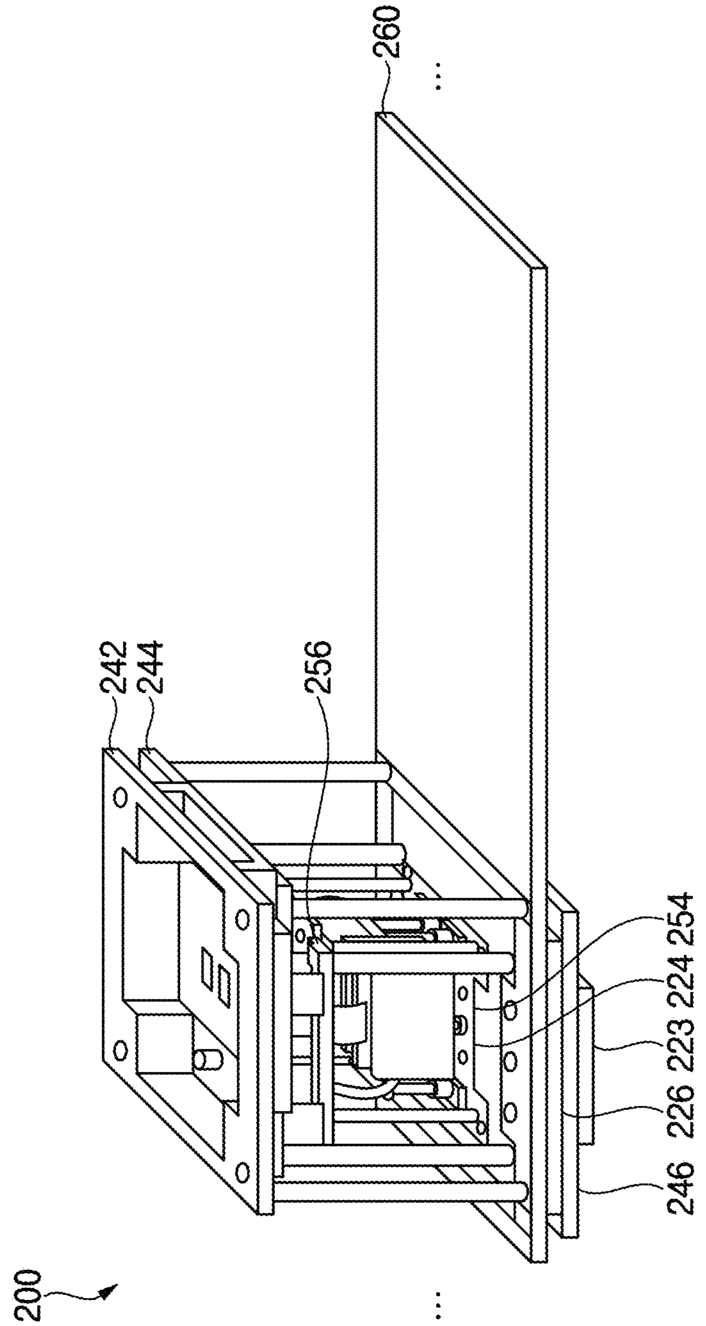

FIG. 10, FIG. 11, and FIG. 12 are perspective views illustrating a method of aligning the inkjet apparatus according to an embodiment of the present disclosure.

Referring to FIG. 10, before the head pack 220 is coupled, the carrier module 240 and the first plate 260 may be coupled, and the second carrier part 244 may contact the first plate 260. The head pack 220 shown in FIG. 4 may be disposed in a space between the second carrier part 244 and the third contact plate 246 of the carrier module 240.

Referring to FIG. 11, the first contact plate 224 and the second carrier part 244 may be coupled, and the second contact plate 226 and the third contact plate 246 may be coupled. For example, as described above in FIG. 4, FIG. 6, FIG. 7, and FIG. 8, the first protrusion 236 and the first depression 256 may be mated, and the second protrusion 254 and the second depression 234 may be coupled. The first protrusion 236 and the first depression 256, and the second protrusion 254 and the second depression 234 may assist in aligning the head pack 220 and the carrier module 240. For example, the mating of the first protrusion 236 and the first depression 256, and the coupling of the second protrusion 254 and the second depression 234 may assist in aligning the second contact plate 226, the third contact plate 246 and the first plate 260 to have a certain positional relationship.

As shown in FIG. 11, after the head pack 220 and the lower part of the carrier module 240 are coupled, the head pack 220 may be moved toward the first carrier part 242 in the third direction DR3. For example, as the second carrier part 244 is moved through the first shaft 248, the head pack 220 coupled to the second carrier part 244 and the third contact plate 246 may be moved in the third direction DR3. That is, the head pack 220 coupled to the carrier module 240 may not be moved in the first direction DR1 or the second direction DR2. The head pack 220 coupled to the carrier module 240 may be fixed in the first direction DR1 and/or the second direction DR2. The head pack 220 coupled to the carrier module 240 fixed in the first direction DR1 and/or the second direction DR2 may be moved in the third direction DR3.

Referring to FIG. 12, part of the head pack 220 may be disposed on an upper part of the first plate 260. The second contact plate 226 of the head pack 220 may be disposed under the first plate 260. For example, the second contact plate 226 may be coupled to the first plate 260 by contacting the lower surface of the first plate 260. The second contact plate 226 may be disposed on the third contact plate 246.

As the head pack 220 moves in the third direction DR3, the first carrier part 242 and the second carrier part 244 of the carrier module 240 may be disposed in direct contact with each other. Accordingly, the second ink control module connection part HC2 of the head pack 220 may be coupled to the cable connection part CC of the second carrier part 244.

In addition, the first ink tube connection part (e.g., the first ink tube connection part ITP1 of FIG. 4) of the first contact plate 224 and the second ink tube connection part (e.g., the second ink tube connection part ITP2) of the first carrier part 242 may be coupled.

As described above, the head pack 220, fixed in the first direction DR1 and/or the second direction DR2, may be moved in the third direction DR3, so that the second ink control module connection part HC2 and the cable connection part CC may be precisely coupled to each other. In addition, the first ink tube connection part and the second ink tube connection part may be accurately coupled to each other. Accordingly, defects in the inkjet printing process may be reduced or prevented, and ink leakage may be prevented.

Meanwhile, after moving the head pack 220, the third contact plate 246 may be coupled to the first plate 260. After the third contact plate 246 and the first plate 260 are coupled, the second contact plate 226 and the first plate 260 may be coupled. This is described in more detail herein with reference to FIG. 14, FIG. 15, FIG. 16, FIG. 17, FIG. 18, and FIG. 19.

According to a method of aligning the inkjet apparatus 100 shown in FIG. 10, FIG. 11, and FIG. 12, the head module 200 shown in FIG. 1 may be aligned.

Meanwhile, a method of aligning the inkjet apparatus 100 may include a process of combining the head pack 220 with the carrier module 240 (e.g., an alignment method of FIG. 10, FIG. 11, and FIG. 12) and a process of separating the head pack 220 from the carrier module 240.

Although not shown in FIG. 10, FIG. 11, and FIG. 12, the process of separating the head pack 220 may include separating the second carrier part 244 from the first carrier part 242 and then moving the second carrier part toward the first plate 260 in a direction opposite to the third direction DR3.

FIG. 10, FIG. 11, and FIG. 12 may illustrate a process in which a new head pack 220 is coupled to the carrier module 240 after the head pack 220 is separated from the carrier module 240.

Figure 13:
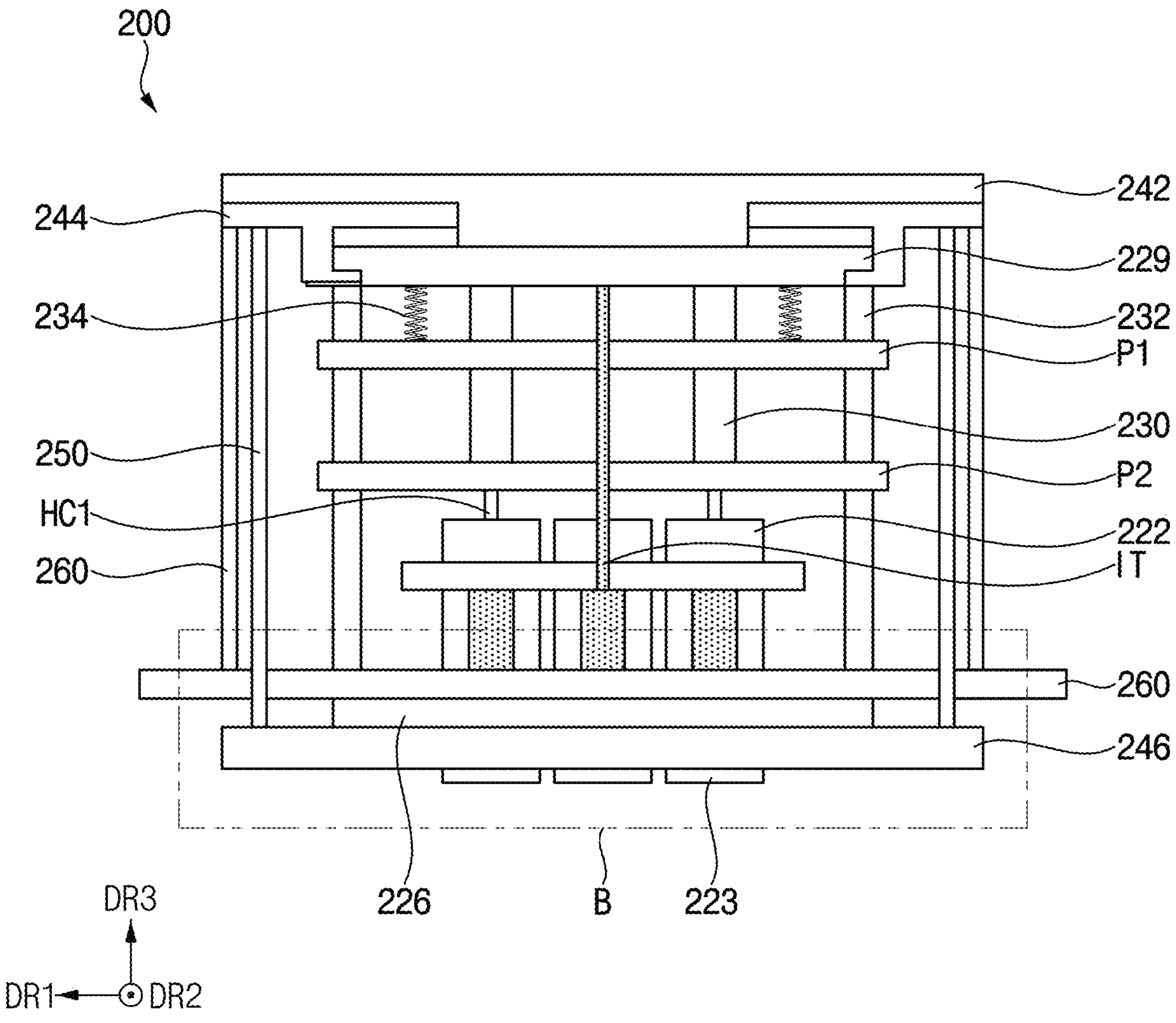
FIG. 13 is a side view illustrating a head module according to a method of aligning the inkjet apparatus of FIG. 10, FIG. 11, and FIG. 12.

FIG. 13 is a side view illustrating a head module according to a method of aligning the inkjet apparatus of FIG. 10, FIG. 11, and FIG. 12. In detail, FIG. 13 is a side view of the head module 200 aligned according to a method of aligning the inkjet apparatus 100 of FIG. 10, FIG. 11, and FIG. 12 as viewed from the second direction DR2.

Referring to FIG. 13, as described above in FIG. 1, FIG. 2, and FIG. 3, the head module 200 may include a second contact plate 226, a third contact plate 246, and a first plate 260. For example, within the head module 200, the second contact plate 226, the third contact plate 246, and the first plate 260 may be coupled to each other.

Figure 14:
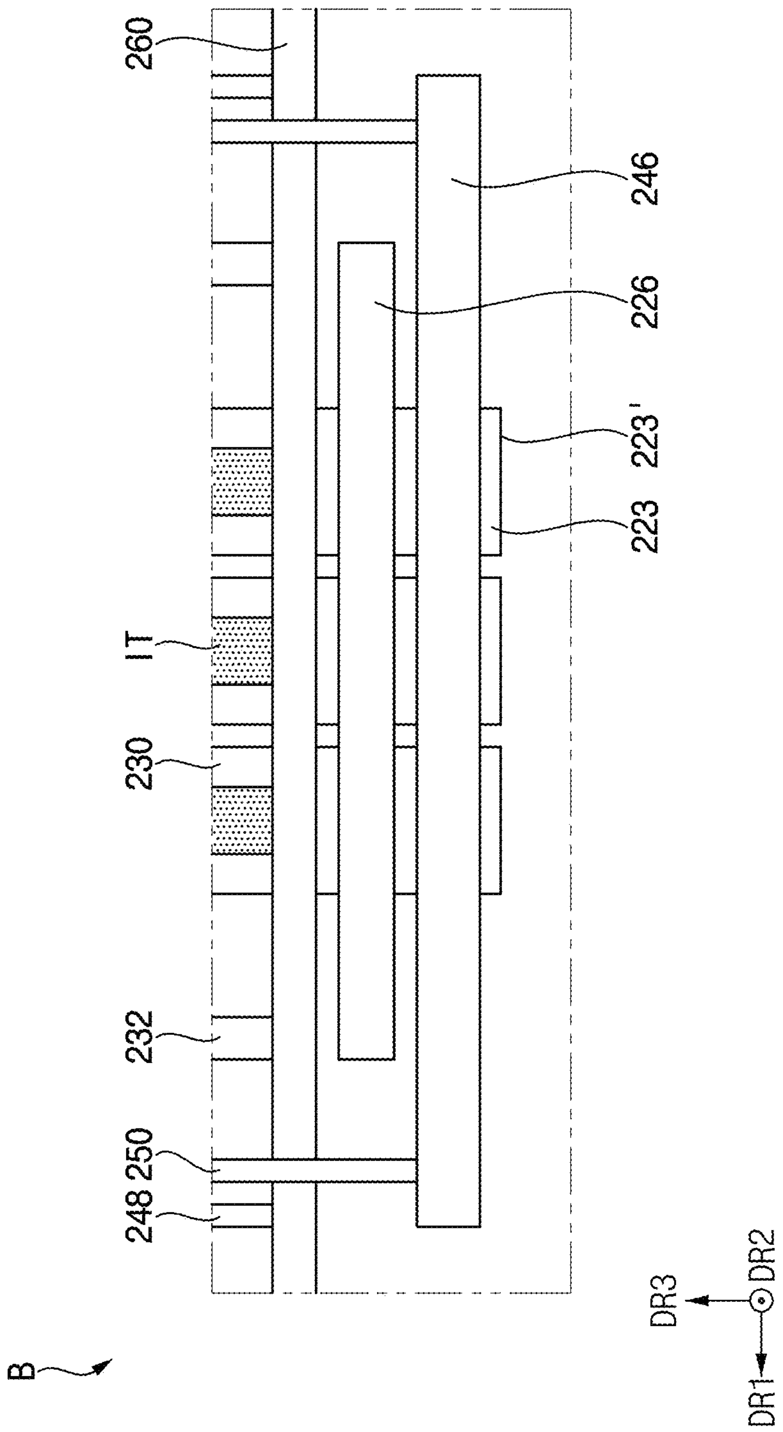
FIG. 14 is a side view of a head module before coupling a first coupling member.
Figure 16:
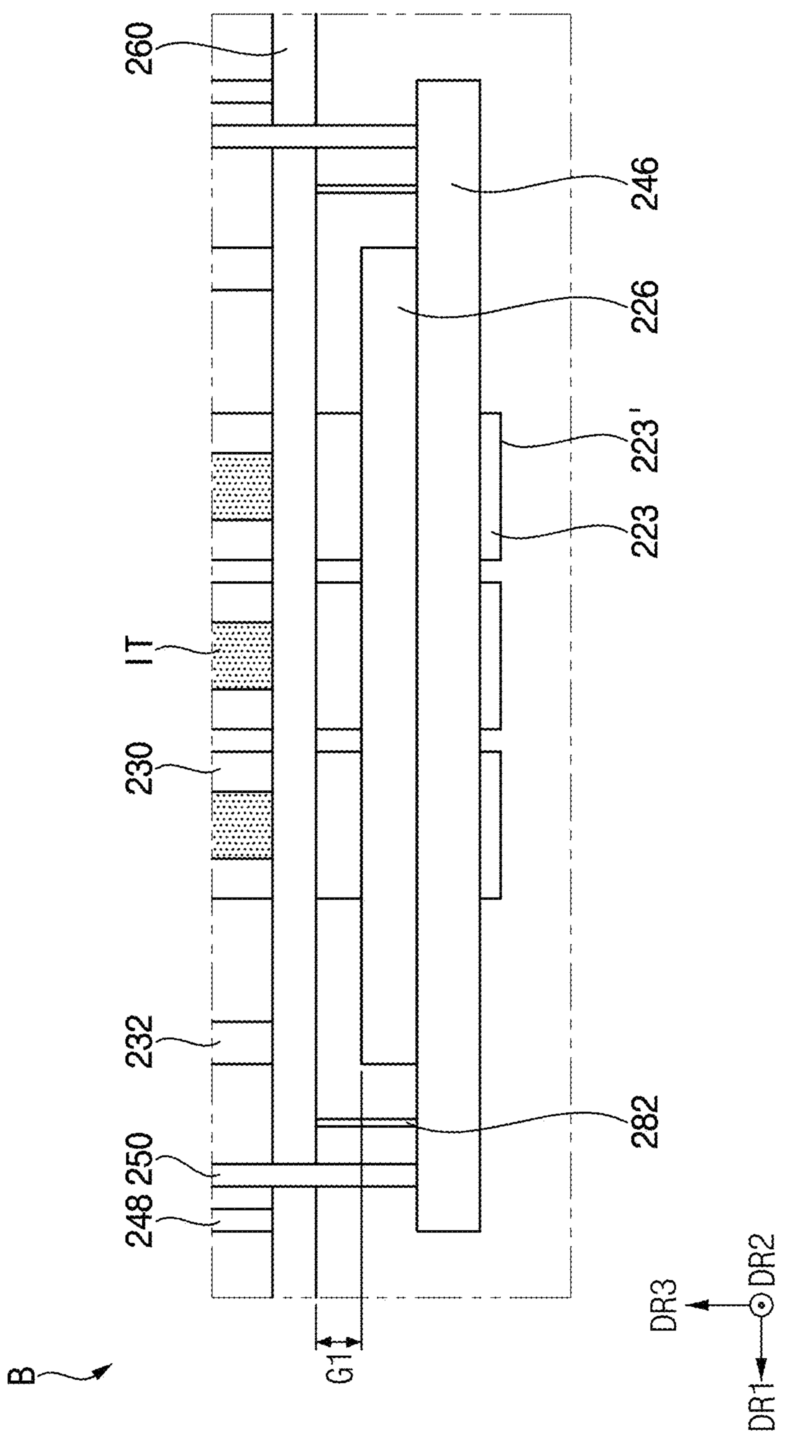
FIG. 16 is a side view illustrating the head module after coupling the first coupling member.
Figure 18:
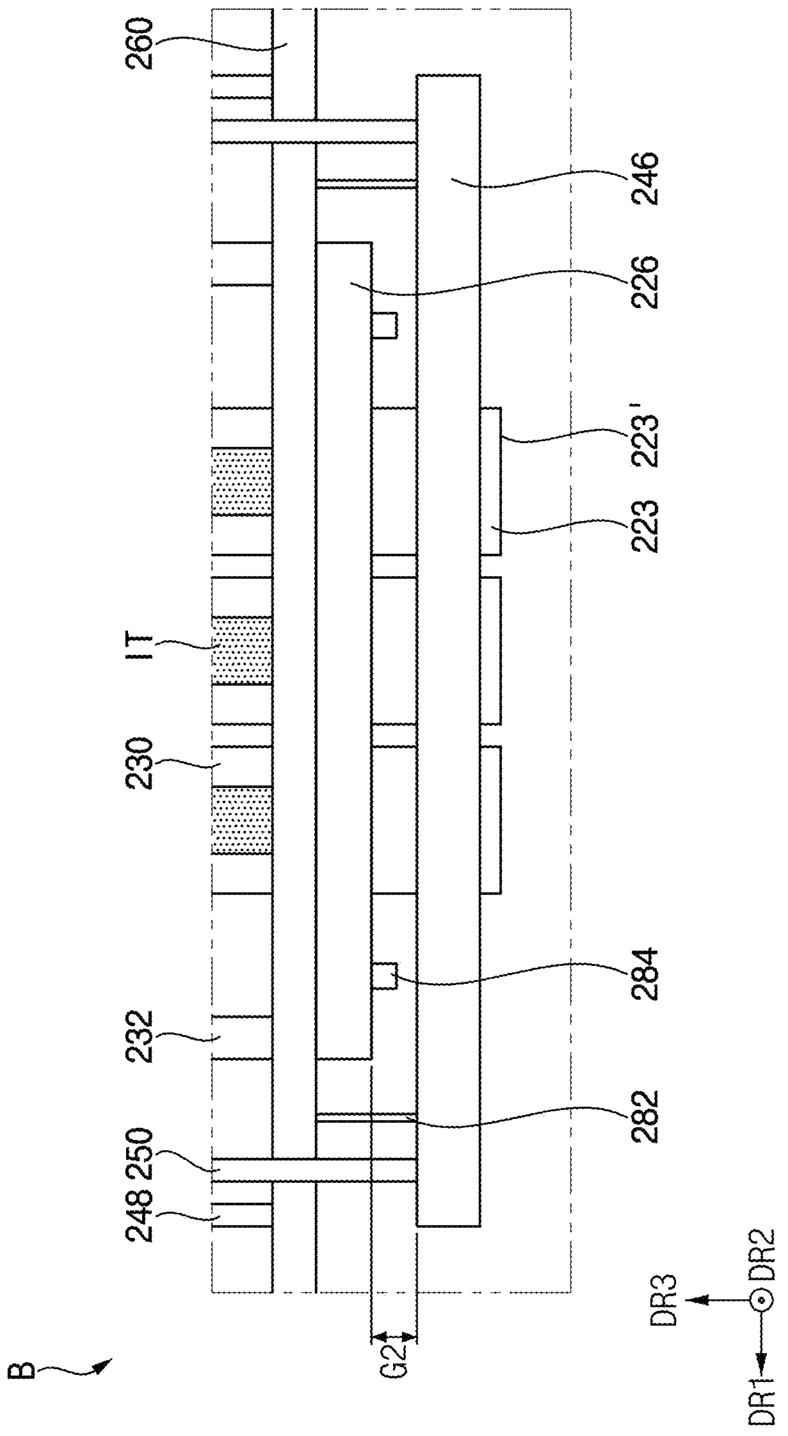
FIG. 18 is a side view illustrating the head module after coupling the second coupling member.

Meanwhile, area "B" in FIG. 13 is an enlarged area showing an arrangement of the second contact plate 226, the third contact plate 246, and the first plate 260. FIG. 14, FIG. 16, and FIG. 18, which sequentially show the part corresponding to the "B" area in FIG. 13. That is, according to a step of combining the first coupling member 282 and the second coupling member 284 included in a method of aligning the inkjet apparatus 100, a positional relationship of the second contact plate 226, the third contact plate 246 and the first plate 260 are shown in an enlarged manner.

Figure 15:
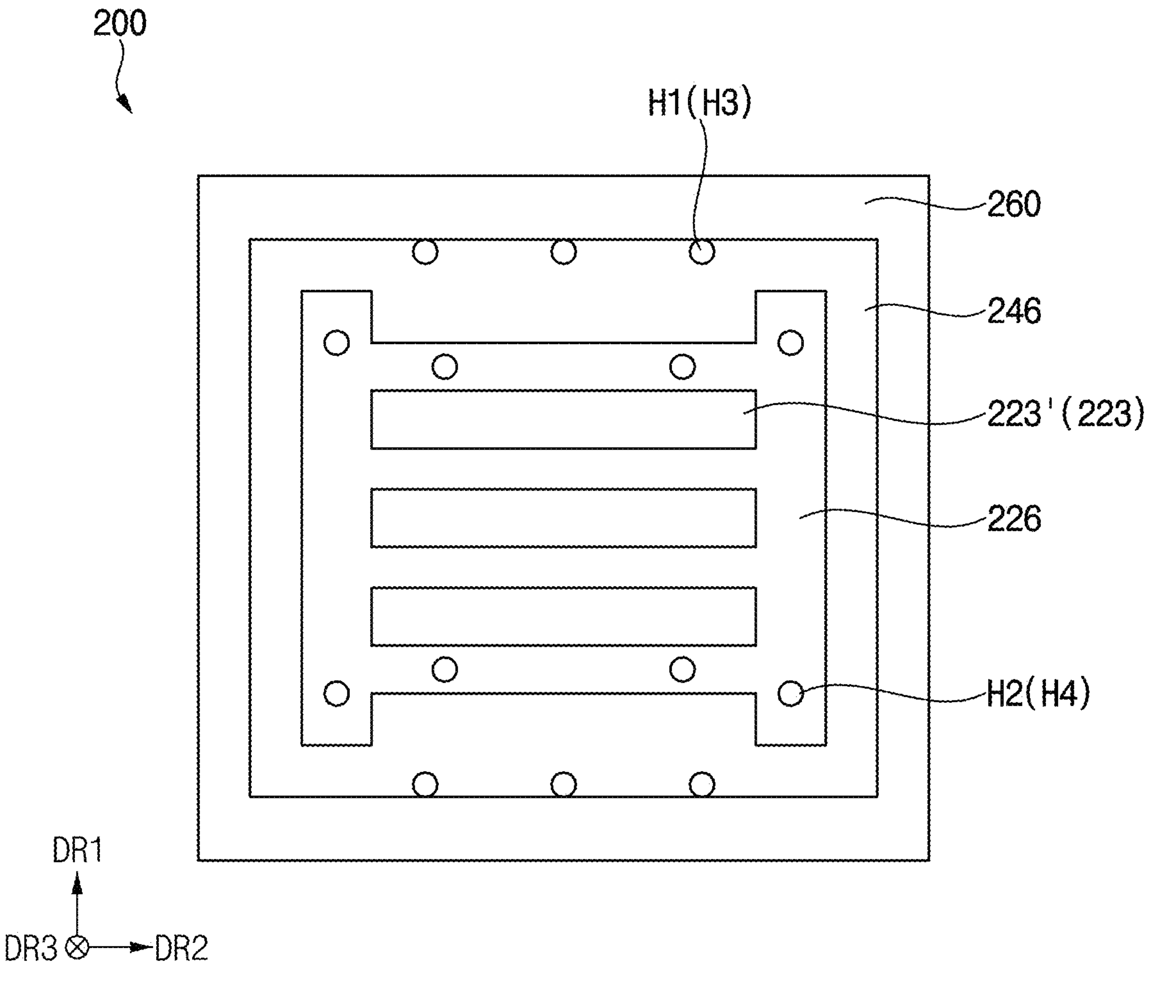
FIG. 15 is a rear view illustrating a head module of FIG. 14.

FIG. 14 is a side view of a head module before coupling a first coupling member. FIG. 15 is a rear view illustrating a head module of FIG. 14.

Referring to FIG. 14, the second contact plate 226, the third contact plate 246, and the first plate 260 may be arranged to be spaced apart from each other. The first plate 260 and the third contact plate 246 may be coupled through the second shaft 250.

However, this may be before the first coupling member 282 may be coupled to the plurality of the first holes H1 of the third contact plate 246 and the plurality of the third holes H3 of the first plate 260. Accordingly, the third contact plate 246 may not be parallel to the first plate 260 depending on the load or external force of the carrier module 240.

Referring to FIG. 14 and FIG. 15, FIG. 15 may be a rear view of the head pack 220 of FIG. 5 with the bottom surfaces of the third contact plate 246 and the first plate 260 added.

The first coupling member 282 and the second coupling member 284 may not be coupled to the head module 200 of FIG. 15. That is, plurality of the first holes H1 of the third contact plate 246 disposed under the first plate 260 may overlap with the plurality of the third holes H3 of the first plate 260 in the third direction DR3. In addition, the plurality of the second holes H2 of the second contact plate 226 disposed under the first plate 260 may overlap with the plurality of the fourth holes H4 of the first plate 260 in the third direction DR3.

Figure 17:
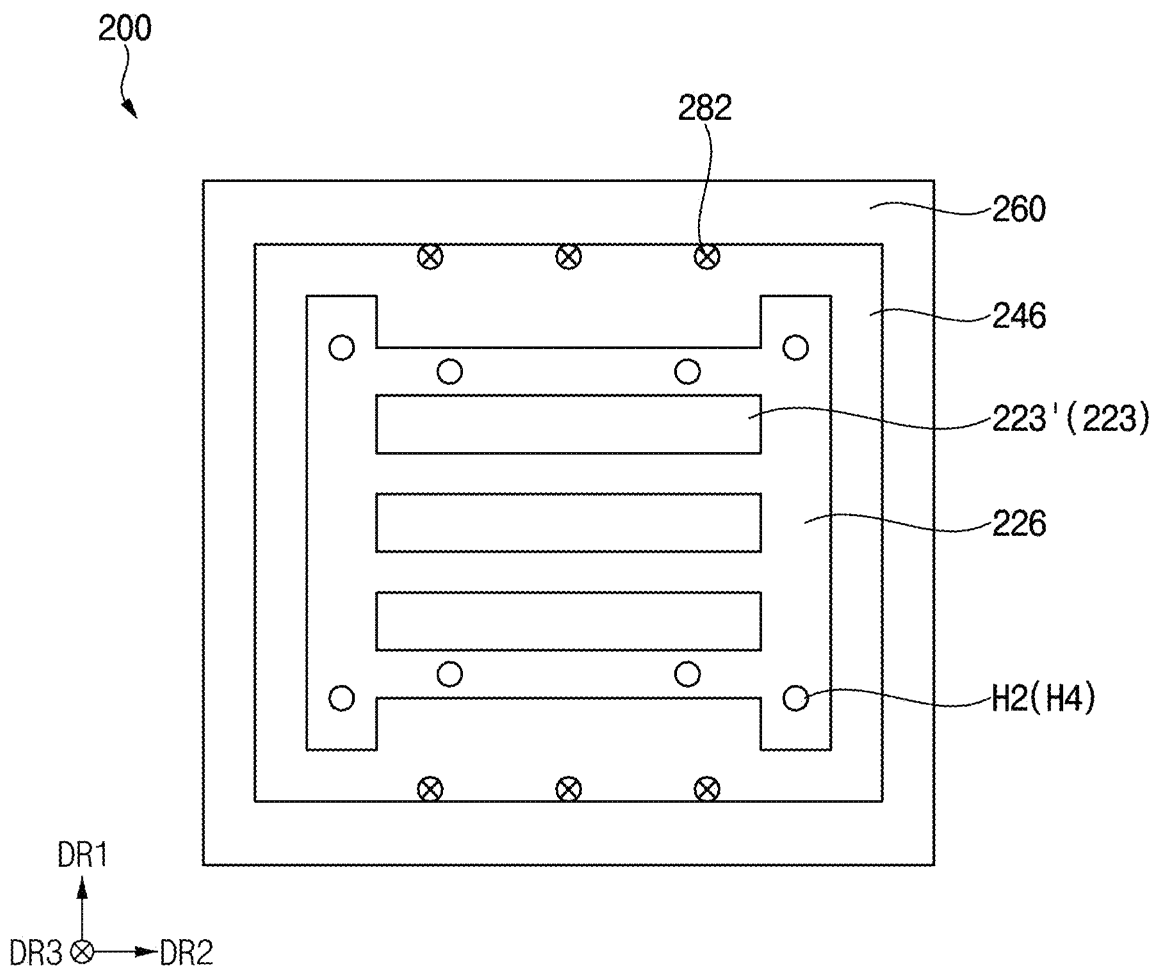
FIG. 17 is a rear view illustrating the head module of FIG. 16.

FIG. 16 is a side view illustrating the head module after coupling the first coupling member. FIG. 17 is a rear view illustrating the head module of FIG. 16.

Referring to FIG. 16, the first coupling member 282 may be disposed between the third contact plate 246 and the first plate 260. For example, the first coupling member 282 may be a fastening member connected by a bolt and a nut. The present disclosure is not limited thereto, and the first coupling member 282 may be variously provided.

In an embodiment, the first coupling member 282 may connect the plurality of the first holes H1 of the third contact plate 246 and the plurality of the third holes H3 of the first plate 260 in the third direction DR3.

In an embodiment, in a step of coupling the first coupling member 282, the second contact plate 226 and the first plate 260 may be spaced apart substantially in parallel. In detail, the first coupling member 282 may be connected between the third contact plate 246 and the first plate 260, and first gap G1 between the second contact plate 226 and the first plate 260 may occur. Accordingly, in a process of coupling the third contact plate 246 and the first plate 260, a flatness of the second contact plate 226 may be maintained.

Referring to FIG. 16 and FIG. 17, and in particular the view of FIG. 17, a configuration of the first coupling member 282 is shown in the plurality of the first holes H1 and the plurality of third holes H3 in the rear view of the head module 200 of FIG. 15.

The second coupling member 284 may not be coupled to the head module 200 of FIG. 17. That is, the plurality of the second holes H2 of the second contact plate 226 disposed under the first plate 260 may overlap with the plurality of the fourth holes H4 of the first plate 260 in the third direction DR3.

Figure 19:
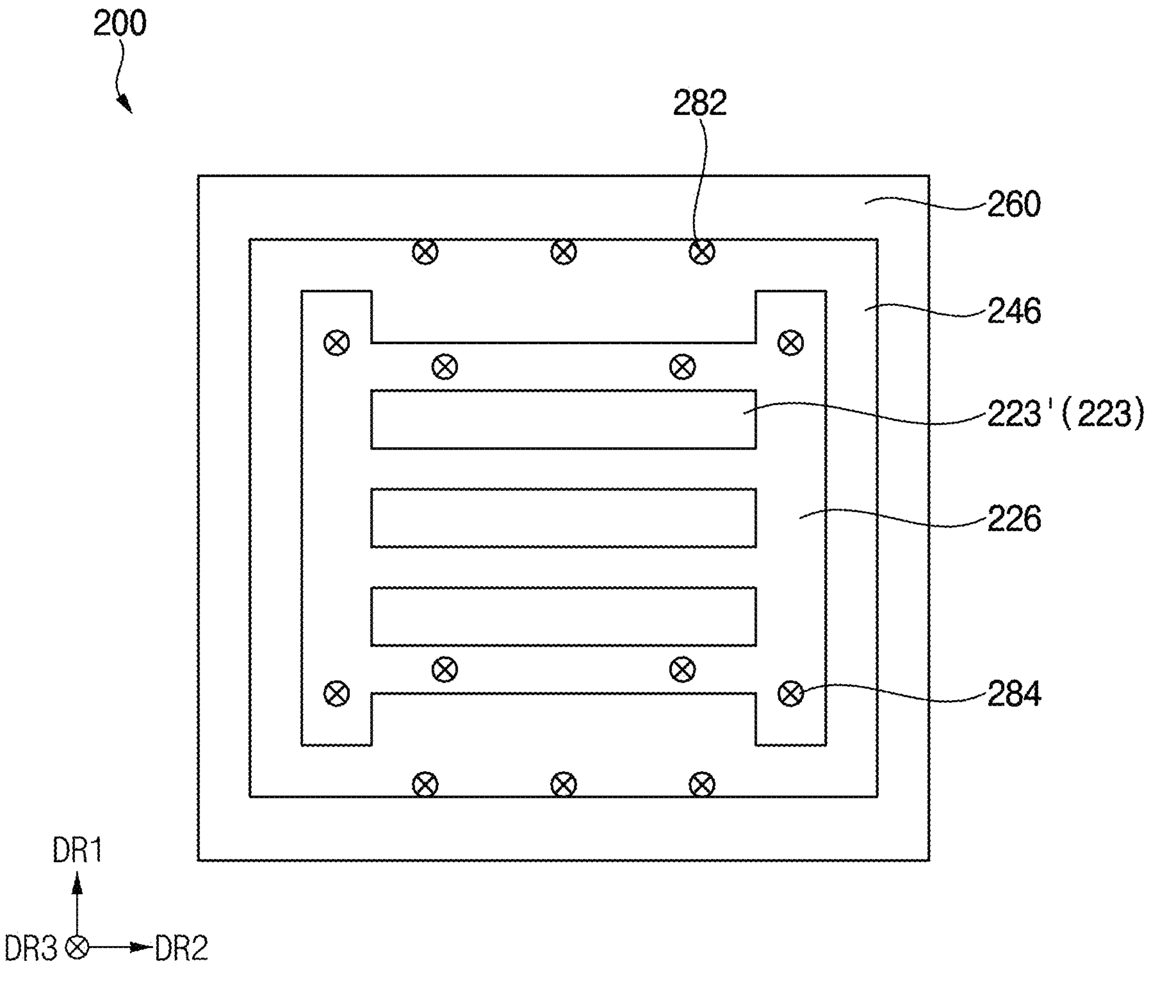
FIG. 19 is a rear view illustrating the head module of FIG. 18.

FIG. 18 is a side view illustrating the head module after coupling the second coupling member. FIG. 19 is a rear view illustrating the head module of FIG. 18.

Referring to FIG. 18, the second coupling member 284 may be disposed between the second contact plate 226 and the first plate 260. For example, the second coupling member 284 may be a fastening member connected by a bolt and a nut. The present disclosure is not limited thereto, and the second coupling member 284 may be variously provided.

In an embodiment, the second coupling member 284 may connect plurality the of second holes H2 of the second contact plate 226 and plurality of the fourth holes H4 of the first plate 260 in the third direction DR3.

In an embodiment, in a step of coupling the second coupling member 284, the second contact plate 226 and the first plate 260 may be spaced apart in the third direction DR3, and may be disposed substantially parallel to each other. In detail, the second coupling member 284 may be connected between the second contact plate 226 and the first plate 260, and a second gap G2 between the second contact plate 226 and the third contact plate 246 may occur. Accordingly, during the process of coupling the second contact plate 226 and the third contact plate 246, the flatness of the second contact plate 226 may be maintained.

Referring to FIG. 18 and FIG. 19, the view of FIG. 19 may be added form with the configuration of the second coupling member 284 in the plurality of the second holes H2 and the plurality of the fourth holes H4 in the rear view of the head module 200 of FIG. 17.

The second coupling member 284 may pass through the openings of the third contact plate 246 (for example, the head coupling part 252 of FIG. 6) and may couple the second contact plate 226 and the first plate 260.

Accordingly, the head module 200 shown in FIG. 1 may be aligned according to a method of aligning the inkjet apparatus 100 shown in FIG. 14, FIG. 15, FIG. 16, FIG. 17, FIG. 18, and FIG. 19.

The second gap G2 between the second contact plate 226 and the third contact plate 246 of the head module 200 may be maintained.

The inkjet apparatus and a method of the aligning the same according to an embodiment may be applied to a manufacture of a display device included in a computer, a notebook, a mobile phone, a smartphone, a smart pad, a PMP, a PDA, an MP3 player, or the like.

Although the inkjet apparatus and a method of the aligning the same according to some embodiments have been described with reference to the drawings, modification and changes may be made by a person having ordinary knowledge in the relevant technical field without departing from the technical spirit described in the following claims.

What is claimed is:

1. An inkjet apparatus comprising:

a first plate, wherein the first plate is moveable; and a carrier module supported by the first plate and configured to receive a head pack including an inkjet head, wherein the carrier module includes:

a first carrier part disposed above the first plate;

a second carrier part, moveable relative to the first carrier part, and disposed under the first carrier part and above the first plate; and a third contact plate, moveable relative to the first carrier part, and disposed under the second carrier part and the first plate.

2. The inkjet apparatus of claim 1, wherein the head pack comprises:

a first contact plate; and a second contact plate disposed under the first contact plate, wherein the second carrier part of the carrier module is detachably coupled to the first contact plate at certain positional relationship.

3. An inkjet apparatus comprising:

a head pack including an inkjet head, a first contact plate and a second contact plate disposed under the first contact plate;

an ink supply module;

a first plate; and a carrier module disposed on the first plate and configured to receive the head pack, wherein the carrier module includes:

a first carrier part connected to the ink supply module;

a second carrier part disposed under the first carrier part and detachably coupled to the first contact plate; and a third contact plate disposed under the second carrier part and detachably coupled to the inkjet head.

4. The inkjet apparatus of claim 3, wherein the carrier module includes:

a first shaft configured to connect the first carrier part and the second carrier part, and configured to move the second carrier part and the third contact plate toward the first carrier part; and a second shaft configured to connect the second carrier part and the third contact plate.

5. The inkjet apparatus of claim 3, wherein the first contact plate includes a first protrusion protruding from a side surface of the first contact plate in a first direction substantially parallel to an upper surface of the first plate, and wherein the second carrier part includes a first depression depressed in an upper surface of the second carrier part.

6. The inkjet apparatus of claim 5, wherein the second contact plate includes a second depression in a direction opposite to the first direction, and wherein the third contact plate includes a second protrusion protruding in the direction opposite to the first direction.

7. The inkjet apparatus of claim 6, wherein the first protrusion is mated to the first depression, and wherein the second protrusion is coupled to the second depression.

8. The inkjet apparatus of claim 3, wherein the inkjet head comprises a plurality of nozzles including nozzle surfaces protruding from a lower part of the third contact plate, and wherein the nozzle surfaces are arranged in a first direction substantially parallel to an upper surface of the first plate and a second direction substantially parallel to the upper surface of the first plate and intersecting the first direction.

9. The inkjet apparatus of claim 8, wherein a thicknesses of the nozzle surfaces in a third direction perpendicular to a plane defined by the first direction and the second direction are substantially equal to each other.

10. The inkjet apparatus of claim 3, wherein the third contact plate of the carrier module includes a plurality of first holes, wherein the second contact plate of the head pack includes a plurality of second holes, wherein the first plate includes a plurality of third holes and a plurality of fourth holes, wherein the plurality of first holes and the plurality of third holes are connected to each other through a first coupling member, wherein the third contact plate and the first plate are coupled to each other through the first coupling member, wherein the plurality of second holes and the plurality of fourth holes are connected to each other through a second coupling member, and wherein the second contact plate and the first plate are coupled to each other through the second coupling member.

11. The inkjet apparatus of claim 10, wherein the second contact plate and the third contact plate are spaced apart from each other in parallel.

12. The inkjet apparatus of claim 3, wherein the head pack further includes:

a first support plate disposed between the first contact plate and the second contact plate;

a second support plate disposed between the first contact plate and the second contact plate and disposed under the first support plate;

an ink control module coupled to the first contact plate, the first support plate, and the second support plate and controlling ink ejection of the inkjet head;

a first support member disposed between the first contact plate and the first support plate; and a second support member configured to connect the first support plate and the second contact plate.

13. The inkjet apparatus of claim 12, wherein the first support member includes an elastic member.

14. The inkjet apparatus of claim 3, further comprising:

a second plate disposed on the first plate and coupled to the ink supply module;

a third plate connected to the first plate and disposed perpendicular to the first plate; and a moving part contacting the third plate and configured to move the inkjet head.

15. The inkjet apparatus of claim 14, further comprising:

a first tension control module connected to the first plate and the second plate; and a second tension control module connected to the first plate and the third plate.

16. A method of aligning an inkjet apparatus, the method comprising:

separating a first carrier part and a second carrier part which are included in a carrier module;

contacting a first contact plate included in a head pack and the second carrier part included in the carrier module;

contacting a second contact plate included in the head pack and a third contact plate included in the carrier module;

moving the second carrier part, the third contact plate, and the head pack through a first shaft included in the carrier module toward the first carrier part;

coupling the third contact plate to a first plate; and coupling the second contact plate to the first plate.

17. The method of claim 16, wherein the contacting the first contact plate and the second carrier part includes mating a first depression included in the second carrier part to a first protrusion included in the first contact plate, and wherein the contacting the second contact plate and the third contact plate includes coupling a second depression included in the second contact plate and a second protrusion included in the third contact plate.

18. The method of claim 16, wherein the contacting the third contact plate and the first plate includes coupling a plurality of first holes of the third contact plate to a plurality of third holes of the first plate through a first coupling member, and wherein the contacting the second contact plate and the first plate includes coupling a plurality of second holes of the second contact plate to a plurality of fourth holes of the first plate through a second coupling member.

19. The method of claim 18, wherein the coupling through the first coupling member includes maintaining a distance between the second contact plate and the first plate supporting the carrier module and the head pack.

20. The method of claim 18, wherein the coupling through the second coupling member includes separating the second contact plate and the third contact plate.

* * * * *